(12) United States Patent
Itoh

(10) Patent No.: US 7,464,352 B2
(45) Date of Patent: Dec. 9, 2008

(54) METHODS FOR DESIGNING, EVALUATING AND MANUFACTURING SEMICONDUCTOR DEVICES

(75) Inventor: Satoshi Itoh, Kanagawa (JP)

(73) Assignee: NEC Electronics Corporation, Tokyo (JP)

( * ) Notice: Subject to any disclaimer, the term of this patent is extended or adjusted under 35 U.S.C. 154(b) by 344 days.

(21) Appl. No.: 11/326,355

(22) Filed: Jan. 6, 2006

(65) Prior Publication Data

US 2006/0156263 A1 Jul. 13, 2006

(30) Foreign Application Priority Data

Jan. 7, 2005 (JP) ............................. 2005-002277

(51) Int. Cl.
*G06F 9/45* (2006.01)
*H01L 29/40* (2006.01)
*H01L 21/4763* (2006.01)

(52) U.S. Cl. .................... 716/5; 716/1; 716/4; 716/15; 257/751; 257/758; 257/774; 438/622; 438/637

(58) Field of Classification Search .................... 716/1, 716/4, 5, 9, 13; 257/48, 774; 438/622, 637; 73/785
See application file for complete search history.

(56) References Cited

U.S. PATENT DOCUMENTS

| | | | |
|---|---|---|---|
| 6,513,389 B2 * | 2/2003 | Suresh et al. ................. 73/785 |
| 6,816,995 B2 * | 11/2004 | Yokogawa ...................... 716/1 |
| 6,823,500 B1 * | 11/2004 | Ganesh et al. ................. 716/9 |
| 7,033,924 B2 * | 4/2006 | Ogawa et al. ............... 438/622 |
| 7,247,946 B2 * | 7/2007 | Bruley et al. ................ 257/751 |
| 7,315,998 B2 * | 1/2008 | Fischer et al. ................ 716/13 |
| 2004/0268275 A1 * | 12/2004 | Cappelletti et al. ............. 716/4 |
| 2005/0006770 A1 * | 1/2005 | Sukharev et al. ............ 257/758 |
| 2006/0190846 A1 * | 8/2006 | Hichri et al. ................... 716/1 |

FOREIGN PATENT DOCUMENTS

JP   7-235596 A   9/1995

OTHER PUBLICATIONS

Ogawa et al.; "Stress-induced voiding under vias connected to wide Cu metal leads"; Apr. 7-11, 2002; Reliability Physics Symposium Proceedings, 2002. 40th Annual; pp. 312-321.*

(Continued)

*Primary Examiner*—Helen Rossoshek
(74) *Attorney, Agent, or Firm*—Sughrue Mion, PLLC

(57) ABSTRACT

A semiconductor device 100 has a configuration having a via 124 formed on a first interconnect 112. A method for designing the semiconductor device 100 includes: calculating an anticipated value $x_{open}$ of a dimension of a growing region of a void 150 expanding in a stress induced voiding (SIV)-ensured time $t_{open}$ at a predetermined temperature, assuming that the void 150 grows from an origin in a copper interconnect (interconnect metallic film 110); and determining a geometric factor of the via 124 by comparing a dimension of a contacting region between a first interconnect 112 and the via 124 with the anticipated value $x_{open}$. The dimension of the contacting region may be presented as d+h (where d represents a diameter of a via 124, and h represents a buried depth that the via 124 is buried within the first interconnect 112).

16 Claims, 17 Drawing Sheets

OTHER PUBLICATIONS

Oshima et al.; "Improvement of thermal stability of via resistance in dual damascence copper interconnection" Dec. 10-13, 2000; Electron Devices Meeting, 2000. IEDM Technical Digest. International; pp. 123-126.*

Park et al.: "Mechanisms of stress-induced voids in multi-level Cu interconnects"; Jun. 3-5, 2002; Interconnect Technology Conference, 2002. Proceedings of the IEEE 2002 International; 130-132.*

Choy et al.; "Effects of capillary forces on the global thinning of copper metallization under electromigration stress"; Oct. 18-21, 2004; Integrated Reliability Workshop Final Report, 2004 IEEE International; pp. 75-78.*

Ueki et al.; "Effects of Ti addition on via reliability in Cu dual damascene interconnects"; Nov. 2004; Electron Devices, IEEE Transactions on; vol. 51, Issue 11, pp. 1883-1891.*

Takashi Suzuki, "Evaluations on Positron Annihilation for Defects in the Plated Cu," Proceedings of the 10th Meeting, The Japan Society of Applied Physics, Thin Film Surface Physics Division, Jul. 15-16, 2004, pp. 22-23.

Mads R. Sørensen, et al. "Diffusion Mechanisms in Cu Grain Boundaries," The American Physical Society, Physical Review B, vol. 62, No. 6, Aug. 1, 2000, pp. 3658-3673.

Chang-Hee Lee, et al. "Residual Stress Effect on Self-Annealing of Electroplated Copper," Jpn. J. Appl. Phys., vol. 42, 2003, pp. 4484-4488.

* cited by examiner

100

FIG. 3A
STRESS S

| STRESS S | AREA RATIO $\sigma$ | SURFACE TREATMENT TIME $t_s$ | $t_{open}$ (hrs) | $A_{SIV}$ |
|---|---|---|---|---|
| 550MPa | 3 | 30 sec. | 450 | 4.00E-16 |
| 315MPa | 3 | 30 sec. | 560 | 3.20E-16 |
| 115MPa | 3 | 30 sec. | 700 | 2.60E-16 |

FIG. 3B
AREA RATIO $\sigma$

| STRESS S | AREA RATIO $\sigma$ | SURFACE TREATMENT TIME $t_s$ | $t_{open}$ (hrs) | $A_{SIV}$ |
|---|---|---|---|---|
| 315MPa | 13 | 30 sec. | 300 | 6.00E-16 |
| 315MPa | 8 | 30 sec. | 400 | 4.50E-16 |
| 315MPa | 3 | 30 sec. | 560 | 3.20E-16 |

FIG. 3C
SURFACE TREATMENT TIME $t_s$

| STRESS S | AREA RATIO $\sigma$ | SURFACE TREATMENT TIME $t_s$ | $t_{open}$ (hrs) | $A_{SIV}$ |
|---|---|---|---|---|
| 315MPa | 3 | 0 sec. | 400 | 4.50E-16 |
| 315MPa | 3 | 30 sec. | 560 | 3.20E-16 |
| 315MPa | 3 | 60 sec. | 850 | 2.10E-16 |

METHODS FOR DESIGNING, EVALUATING AND MANUFACTURING SEMICONDUCTOR DEVICES

This application is based on Japanese Patent Application NO. 2005-002,277, the content of which is incorporated hereinto by reference.

BACKGROUND

1. Technical Field

The present invention relates to a method for designing a semiconductor device, and to a method for evaluating reliability thereof.

2. Related Art

In recent years, for the purpose of satisfying the increasing requirements for achieving higher level of integration in a semiconductor device, copper becomes to be widely utilized for a material of interconnect lines or plugs. Copper is a material, which is characterized in having a lower resistance and a better electromigration resistance than that of aluminum that has been conventionally employed.

On the contrary, the generation of electromigration has become a problem in such type of the interconnect made of copper. FIG. 17 is a schematic cross sectional view of a copper multiple-layered interconnect formed via a damascene process. The copper multiple-layered interconnect has a configuration, in which an upper layer interconnect 30 is coupled to an upper portion of a lower layer interconnect 12 through a via 24. In such copper multiple-layered interconnect, a void 10 may be generated at an interface between the lower layer interconnect 12 and the via 24 due to a stress migration in copper, leading to a coupling failure between the interconnects. This causes problems of a reduction in a production yield of semiconductor devices or an unstable operation of semiconductor device in the long term use.

Japanese Patent Laid-Open No. H7-235,596 describes an interconnect structure of a semiconductor device, which include a lower layer interconnect formed on a base member and composed of an electrically conducting layer (barrier metal layer) and an aluminum-containing alloy layer formed thereon, an interlayer insulating layer formed on the base member and the lower layer interconnect, an opening formed in the interlayer insulating film above the lower layer interconnect and extending through the aluminum-containing alloy layer to the electrically conducting layer, and an upper layer interconnect formed in the opening and on the interlayer insulating layer and electrically coupled to the lower layer interconnect. It is described in Japanese Patent Laid-Open No. H7-235,596 that, since the opening extends through the aluminum-containing alloy layer to the electrically conducting layer, and the upper layer interconnect electrically coupled to the lower layer interconnect is formed in this opening, the upper layer interconnect is ensured to be electrically coupled to the lower layer interconnect even though voids are generated due to an electromigration and/or a stress migration in the aluminum-containing alloy layer located in vicinity of the bottom of the opening, thereby allowing to obtain the interconnect structure having higher reliability.

However, when a configuration including the via extending through the lower layer interconnect to contact with the barrier metal film on the bottom of the lower layer interconnect is employed as described in Japanese Patent Laid-Open No. H7-235,596, a barrier metal film of the via comes in contact with a barrier metal film of the lower layer interconnect, leading to a problem of an increased interconnect resistance. In particular, when the void is generated between the side wall of the via and the lower layer interconnect, the configuration including the electrical coupling between the barrier metal films exhibits unwanted higher resistance. Once such situation is attained, it is impossible to maintain lower resistance even if copper is employed for the interconnect material.

SUMMARY OF THE INVENTION

According to the present invention, there is provided a method for designing a semiconductor device including a structure that has a via formed on a copper interconnect, comprising: calculating an anticipated value $x_{open}$ of a dimension of a growing region of a void expanding in a stress induced voiding (SIV)-ensured time $t_{open}$ at a predetermined temperature, assuming that the void grows from an origin in the copper interconnect; and determining a geometric factor of the via by comparing a dimension of a contacting region between the copper interconnect and the via with the anticipated value $x_{open}$.

A present inventors have had an assumption that a coupling failure between the copper interconnect and the via is occurred, when the growing region of the void growing from an origin in the copper interconnect expands to the entire contacting region between the copper interconnect and the via. The growing region of the void expands over time. On the contrary, the contacting region between the copper interconnect and the via is determined by the geometric factor of the via. Since the geometric factor of the via is determined in the light of the anticipated value $x_{open}$ of the dimension of the growing region of the void expanding in the desired stress induced voiding (SIV)-ensured time $t_{open}$ according to the present invention, the coupling failure between the copper interconnect and the via occurred in the SIV-ensured time $t_{open}$ can be prevented. This allows designing the semiconductor device having the desired reliability.

For example, the determining the geometric factor of the via according to the above aspect of the present invention may include determining the geometric factor of the via so that the dimension of the contacting region is not smaller than the anticipated value $x_{open}$. This prevents causing the coupling failure between the copper interconnect and the via in the SIV-ensured time $t_{open}$.

In addition, for example, the determining the geometric factor of the via according to the above aspect of the present invention may also include correcting the dimension or the anticipated value $x_{open}$ of the contacting region to determine the geometric factor of the via, so that the dimension of the contacting region is equal to or higher than the anticipated value $x_{open}$ after the correction.

According to the present invention, there is provided a method for evaluating reliability of a semiconductor device including a structure that has a via formed on a copper interconnect, comprising: calculating a dimension of a contacting region between the copper interconnect and the via on the basis of a geometric factor of the via; and calculating a stress induced voiding (SIV)-ensured time $t_{open}$ by comparing a dimension of the contacting region with an anticipated value x of a dimension of a growing region of a void expanding in a processing time x at a predetermined temperature, assuming that the void grows from an origin in the copper interconnect.

According to the present invention, the SIV-ensured time $t_{open}$ can be calculated by comparing the anticipated value x of the growing region of the void with the dimension of the contacting region between the copper interconnect and the via, calculated on the basis of the geometric factor of the via. Having this configuration, the SIV-ensured time $t_{open}$ can be calculated with an improved accuracy, without a need for conducting the time-consuming SIV test. Having this configuration, the evaluation on the reliability of the semiconductor device can be simply conducted with an improved accuracy.

For example, the calculating the SIV-ensured time $t_{open}$ according to the above aspect of the present invention may include calculating the processing time t required for attaining the anticipated value x that is equal to or higher than the dimension of the contacting region to assign the calculated processing time t to the SIV-ensured time $t_{open}$.

In addition, for example, the calculating the SIV-ensured time $t_{open}$ according to the above aspect of the present invention may also include correcting the anticipated value x or the dimension of the contacting region, and calculating the processing time t required for attaining the anticipated value x at a level of equal to or higher than the dimension of the contacting region to present the SIV-ensured time $t_{open}$ after the correction.

According to the present invention, a semiconductor device having a desired reliability can be designed. In addition, according to the present invention, reliability of a semiconductor device can be evaluated with an improved accuracy without a need for conducting a time-consuming test.

BRIEF DESCRIPTION OF THE DRAWINGS

The above and other objects, advantages and features of the present invention will be more apparent from the following description taken in conjunction with the accompanying drawings, in which:

FIGS. 3A to 3C are tables, showing respective conditions of variables of: a stress S exerted on the interconnect; a surface treatment time $t_s$ conducted for the first interconnect; and an area ratio σ presented by dividing area of portions having <111> orientation by area of portions having <100> orientation in Cu of the first interconnect;

DETAILED DESCRIPTIONS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, an identical numeral is assigned to an element commonly appeared in the figures, and the detailed description thereof will not be presented.

Figure 1:
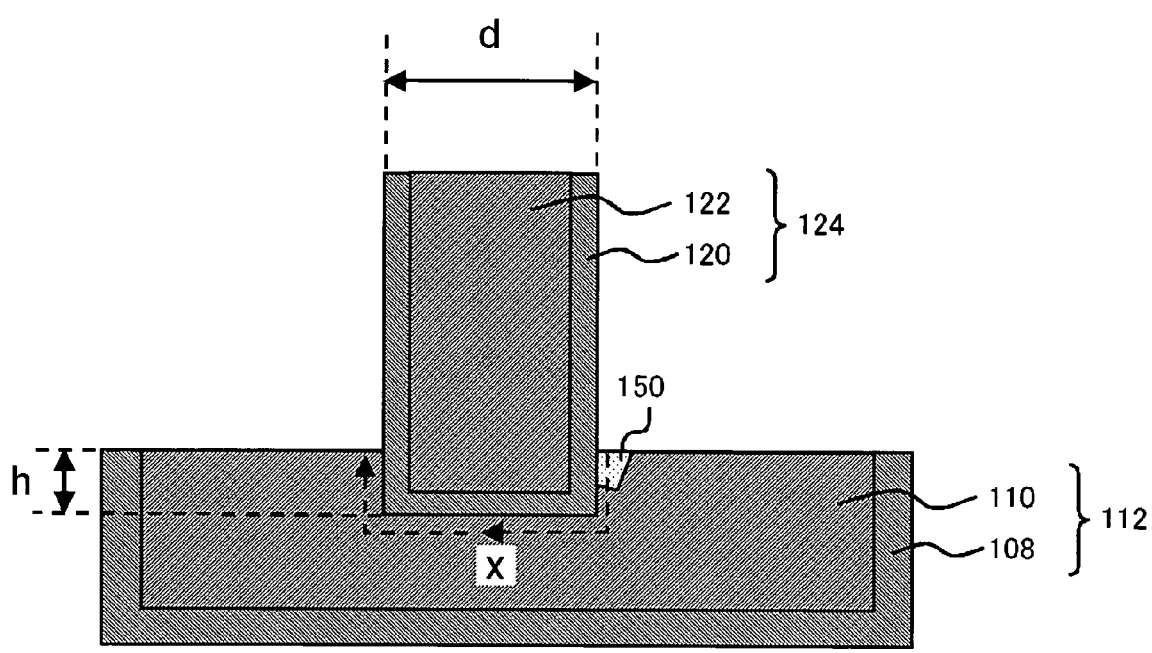
FIG. 1 is a cross-sectional view of a semiconductor device, illustrating a model, in which a void created in a sidewall or in a lower portion of a via grows by diffusing along an interface between the via and the first interconnect in a process for manufacturing a semiconductor device.
Figure 2:
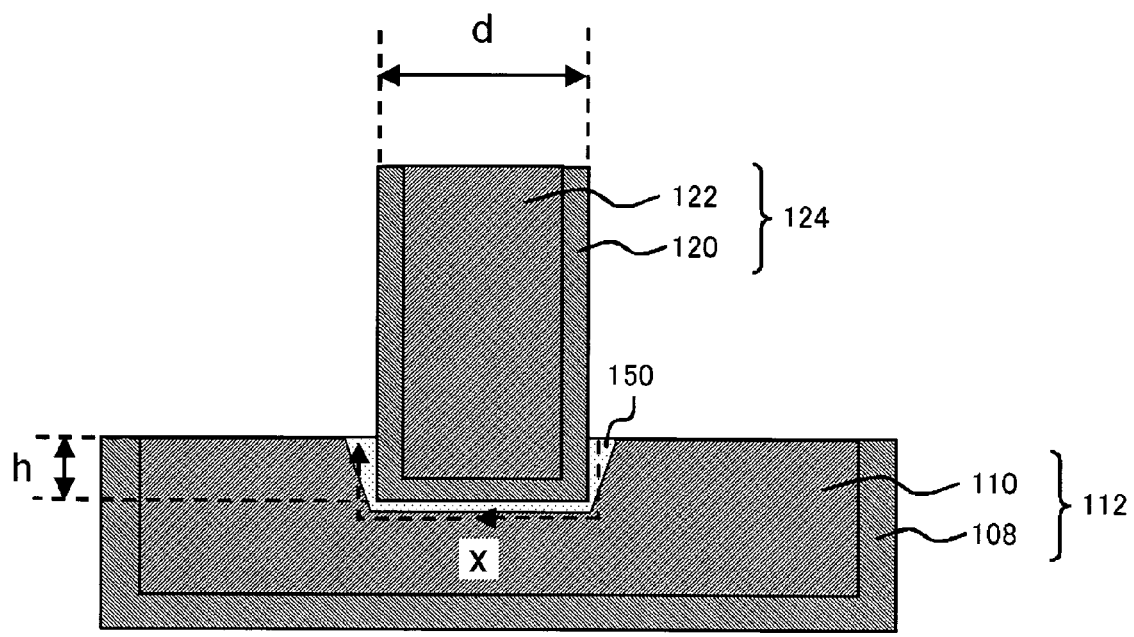
FIG. 2 is a cross-sectional view of a semiconductor device, illustrating a model, in which a void created in a sidewall or in a lower portion of a via grows by diffusing along an interface between the via and the first interconnect in a process for manufacturing a semiconductor device.

The present inventor propose a model, based on an assumption that a void 150 created in a sidewall of a via 124 or in a lower portion of the via 124 grows by diffusing along an interface between the via 124 and the first interconnect 112 in a process for manufacturing a semiconductor device 100. FIG. 1 and FIG. 2 are diagrams, showing such type of a model.

The semiconductor device 100 include a first interconnect 112 that is composed of a barrier metal film 108 and an interconnect metallic film 110, and a via 124 that is composed of a barrier metal film 120 and a via metallic film 122 and is formed on the first interconnect 112. In this embodiment, the interconnect metallic film 110 is composed of copper.

FIG. 1 represents a condition of the void 150 formed at a side wall of the via 124. Here, a symbol "x" represents an anticipated value of a growth length of the void 150 growing from an origin at a predetermined temperature. A symbol "d" represents a diameter of a via 124, and "h" represents a buried depth that the via 124 is buried within the first interconnect 112 (or a dug depth of the via hole).

FIG. 2 shows a condition, where the void 150 shown in FIG. 1 diffuses toward a direction indicated by an arrow to be formed over the entire interface between the first interconnect 112 and the via 124. When the void 150 expands over the entire interface of the via 124 and the first interconnect 112 as shown in FIG. 2, a coupling failure is occurred between the via 124 and the first interconnect 112. More specifically, when X is increased to a level equal to or larger than the path length L extending from one end to the other end of a contacting region between the first interconnect 112 and the via 124, a coupling failure is occurred between the via 124 and the first interconnect 112. While x is shorter than the path length L, the electrical coupling between the via 124 and the first interconnect 112 could be maintained. Therefore, the SIV reliability can be improved by designing the semiconductor device 100 so that the extended length x of the void 150 extending during an SIV test at a predetermined temperature and in a predetermined time be equal to or larger than the path length L. In this case, the path length L may be selected to be the longest distance existing in the contacting region between the first interconnect 112 and the via 124. In the present embodiment, the path length L may be selected as: path length L=d+2 h. Here, alternative configuration having the via 124 that is not buried within the first interconnect 112 (i.e., h=0) may also be employed for the semiconductor device 100 of the present embodiment.

Next, a method for calculating the extended length x of the void 150 extending during an SIV test at a predetermined temperature and in a predetermined time will be described. By employing Fick's second law, where x is a diffusion length of the void 150, D is a diffusion constant, and t is a test time, the concentration of Cu: C(x, t) may be presented as a form of the following formula by employing Gaussian error function erf, where $C_O$ represents a concentration of copper (Cu) in the interconnect metallic film 110:

(formula 1)
$$C(x, t) = C_0 \left\{ \left( 1 - erf\left( \frac{x}{2\sqrt{D \cdot t}} \right) \right) \right\} \quad (1)$$

Diffusion constant $D_{SIV}$ in the SIV test can be obtained by the following formula: where $D_{stress}$ (hereinafter "$D_{st}$") is a diffusion constant that is variable according to a tensile stress (hereinafter simply referred to as "stress") existing in the first interconnect 112; $D_{grainboundary}$ (hereinafter "$D_{gb}$") is a diffusion constant that is variable according to an orientation of the surface of the first interconnect 112; and $D_{interface}$ (hereinafter "$D_{in}$") is a diffusion constant that is variable according to a surface treatment conducted over the surface of the first interconnect 112. In addition, other type of diffusion constants, for example, a diffusion constant that is variable according to a diffusion of Cu in a grain are not considered here, since the diffusion constant is on the order of 1/10000 of $D_{gr}$ (see Mads R. Sorensen, Physical Review B, Volume 62, No. 6, August, 2000, pp. 3658).

(Formula 2)
$$D_{SIV} \approx D_{st} + D_{gb} + D_{in} \quad (2)$$

This formula can be expressed by utilizing Gaussian function to present the following form: where "A" is a pre-exponential factor; "a" is a proportional constant; "T" is a temperature during the test; and "$T_{peak}$" is a peak temperature.

(Formula 3)
$$D_{SIV} \approx A_{SIV} \exp(-a(T-T_{peak})^2) \quad (3)$$

(Formula 4)
$$D_{SIV} \approx (A_{st} + A_{gb} + A_{in}) \exp(-a(T-T_{peak})^2) \quad (4)$$

Equation 4 is substituted into formula 1 as defining $D = D_{SIV}$ to obtain the following result:

(formula 5)
$$C(x, t) = C_0 \left\{ \left( 1 - erf\left( \frac{x}{2\sqrt{(A_{st} + A_{gb} + A_{in}) \exp(-a(T - T_{peak})^2) \times t}} \right) \right) \right\} \quad (5)$$

Next, respective coefficients are calculated. In this case, an SIV test was conducted by using 10,000 via chains, which have structures including: the diameter d of the via 124 is d=200 nm; the buried depth h of the via 124 is h=60 nm; the width of the first interconnect 112 is 10 μm; and the height of the interconnect is 250 nm. The test temperatures were selected as: 100 degree C.; 125 degree C.; 140 degree C.; 150 degree C.; 160 degree C.; 175 degree C.; and 200 degree C.

FIG. 3A shows a conditions in which a stress S exerted on the interconnect is varied. FIG. 3B shows a conditions in which an area ratio σ presented by dividing area of portions having <111> orientation by area of portions having <100> orientation in Cu of the first interconnect 112. FIG. 3C shows a conditions in which a surface treatment time $t_s$ conducted for the first interconnect 112 (where the surface treatment is a silane-exposure).

Samples were prepared as presenting:

(i) larger stress S (550 MPa), medium stress S (315 MPa), smaller stress S (115 MPa), (surface treatment time $t_s$=30 sec., area ratio σ=3 in each case) (FIG. 3A);

(ii) area ratio σ of 3, 8 and 13 (stress S=315 MPa, surface treatment time $t_s$=30 sec. in each case) (FIG. 3B); and (iii) surface treatment time $t_s$ of 0 sec., 30 sec., and 60 sec. (stress S=315 MPa, area ratio σ=3 in each case) (FIG. 3C). Electric current is applied thereto in every ten hours in the SIV test, and it was determined that the void 150 diffuses by a distance of d+2 h (320 nm in this case) and the open failure was occurred at the time $t_{open}$ when the resistance per one via exceeded 1 MΩ. The methods for calculating respective values will be described as follows.

The stress was calculated on the basis of formula 6, utilizing x-ray diffractometry (XRD) (see Chang-Hee Lee, Jpn. J. Appl. Phys., Volume 42, Part 1, No. July, 2003, pp. 4486). Here, E represents Young's modulus; v represents Poisson's ratio; ψ represents a tilt angle over the sample surface; $d_i$ represents a spacing between the sample surface and a surface tilted over the sample surface by a tilt angle ψ; and $d_n$ represents a spacing between the sample surface and a surface parallel to the sample surface.

(formula 6)
$$S = \frac{E}{(1+v)\sin^2\psi}\left(\frac{d_i - d_n}{d_n}\right) \quad (6)$$

A crystal orientation of Cu was obtained by employing electron backscatter diffraction patterns (EBSP).

In the meantime, it is reported that one vacancy exists per about 700 Cu atoms (see Takashi Suzuki, "Mekki Cu Chu No Kekkan No Yodenshishometsu Hyoka" (Evaluations on Positron Annihilation for defects in The Plated Cu), Conference Featuring Atomic Transportation/Stress Issues in LSI Interconnect, Proceedings of 10th Meeting, The Japan Society of Applied Physics, Thin Film Surface Physics Division, Jul. 15 to 16, 2004, pp. 22 to 23). In this case, $t_{open}$ is presented as a time required for achieving that all 700 Cu atoms other than vacancy (i.e., (1−1/700)=0.9986 $C_o$) become voids, where $C_o$ represents a concentration of Cu in the interconnect metallic film 110. In other words, the C(x,t) is 0.9986 $C_o$ at when t=$t_{open}$. Therefore formula 1 can be modified to present the following formula:

(formula 7).
$$C(x_{open}, t_{open}) = C_0 \left\{ \left( 1 - erf\left( \frac{x_{open}}{2\sqrt{D_{siv} \times t_{open}}} \right) \right) \right\} \approx 0.9986 C_0 \quad (7)$$

Figure 4:
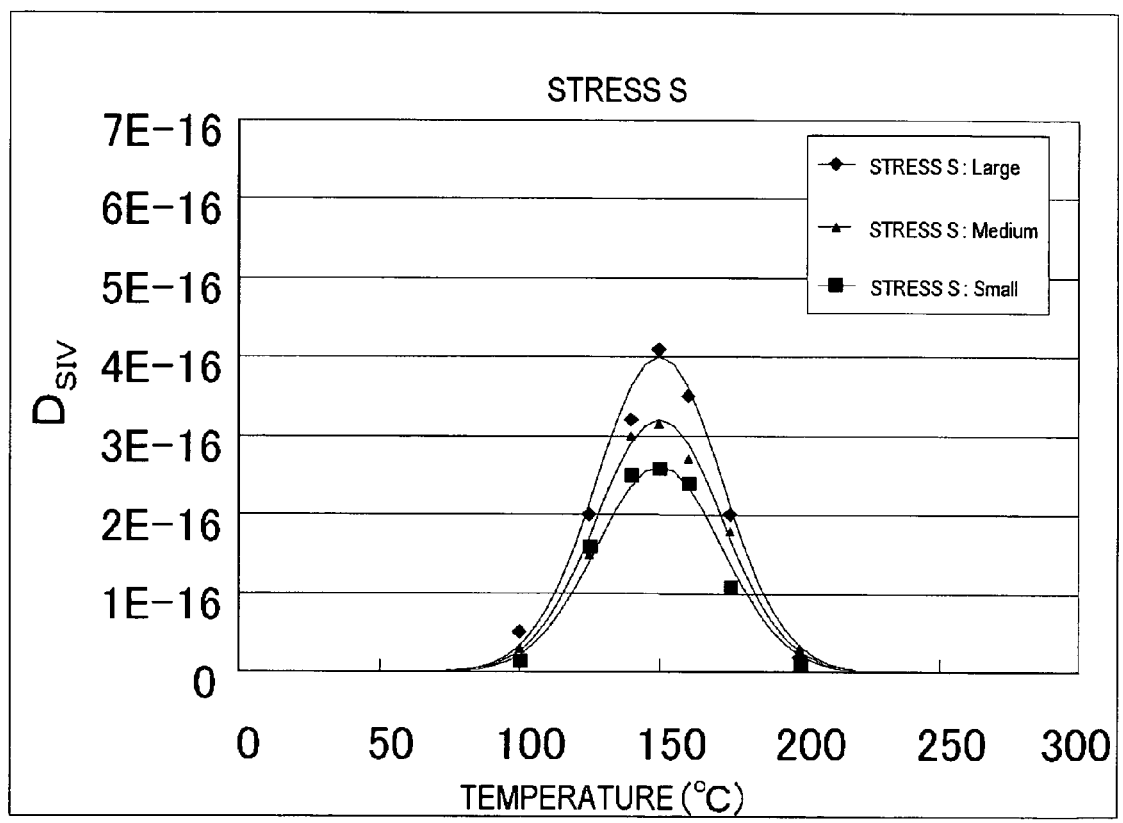
FIG. 4 is a graph, showing $D_{SIV}$ at respective test temperatures.
Figure 5:
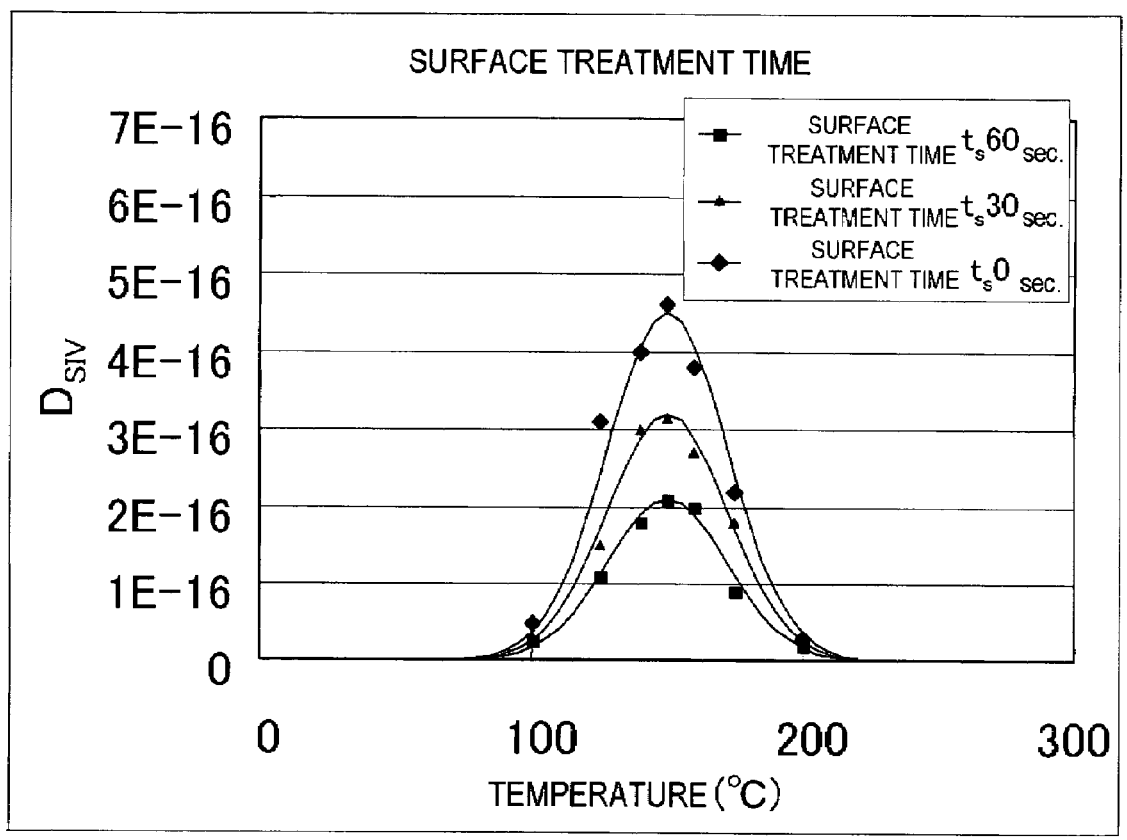
FIG. 5 is a graph, showing $D_{SIV}$ at respective test temperatures.
Figure 6:
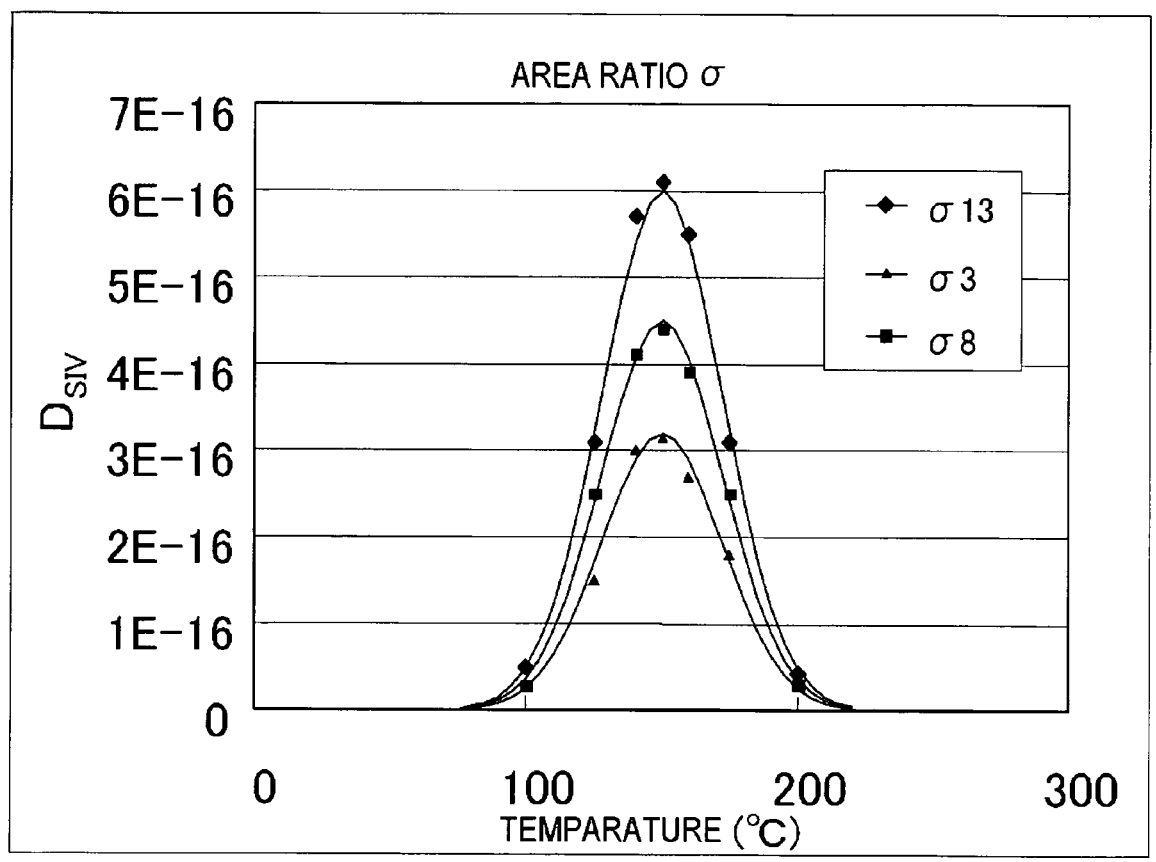
FIG. 6 is a graph, showing $D_{SIV}$ at respective test temperatures.

Values of $t_{open}$ and $x_{open}$=d+2 h were substituted into formula 7 to calculate $D_{SIV}$ at each test temperature. The results thereof are shown in FIG. 4 to FIG. 6. Subsequently, a=0.001, $T_{peak}=150$ degree C. and $A_{SIV}$ were obtained based on $D_{SIV}$-T curve and formula 3. Values of $t_{open}$ and $A_{SIV}$ are shown in FIG. 3.

Figure 7:
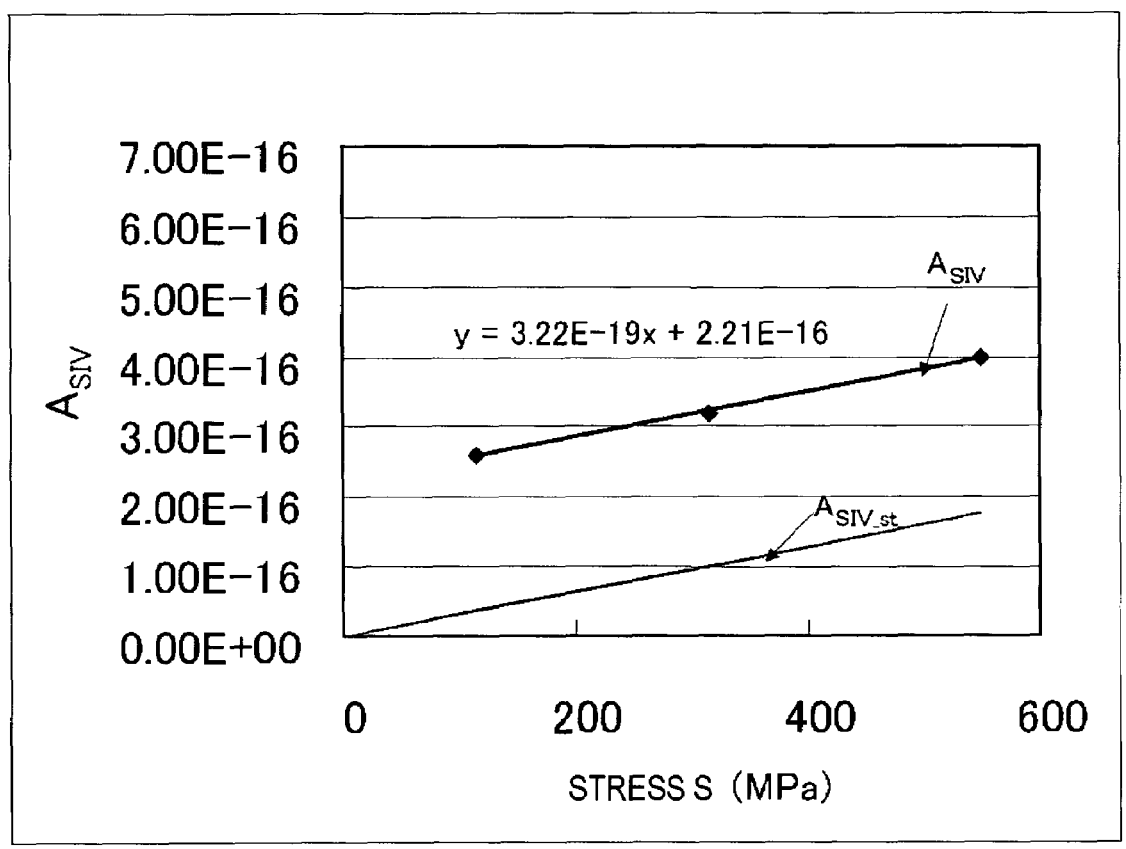
FIG. 7 is a graph, showing relationships of $A_{SIV}$ with the interconnect parameter (stress S)
Figure 8:
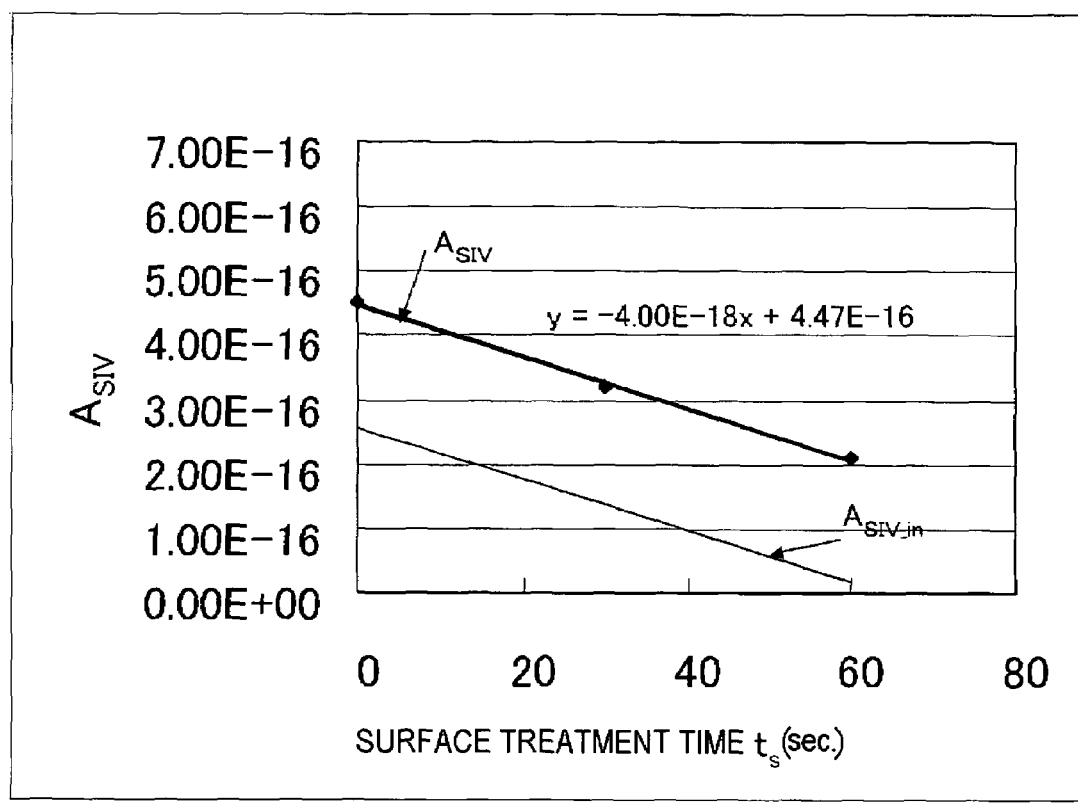
FIG. 8 is a graph, showing relationships of $A_{SIV}$ with the interconnect parameter (surface treatment time $t_s$)
Figure 9:
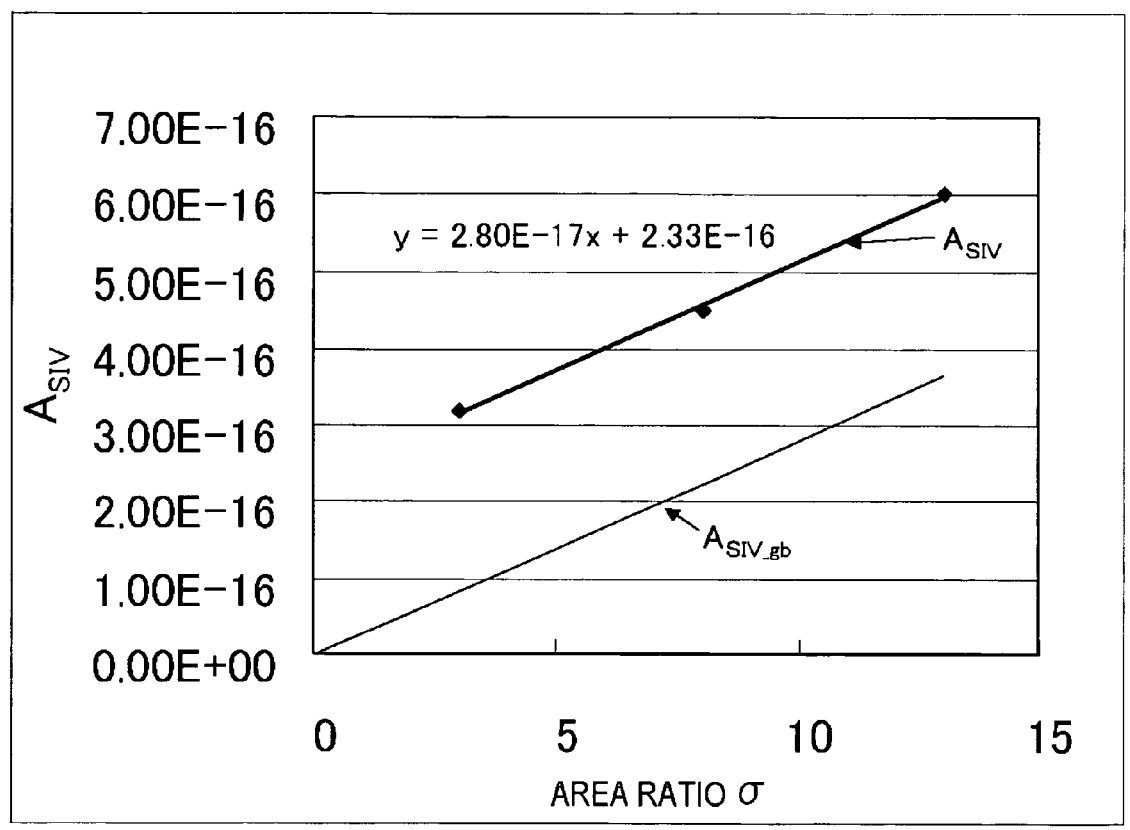
FIG. 9 is a graph, showing relationships of $A_{SIV}$ with the interconnect parameter (area ratio σ)

Relationship of $A_{SIV}$ with the interconnect parameters (stress S, surface treatment time $t_s$, area ratio σ) are shown in FIG. 7 to FIG. 9. Since the values of $A_{SIV}$ are obtained on the basis of all parameters of stress S, surface treatment time $t_s$ and area ratio σ, it was assumed that $A_{SIV}$ concerning stress is zero in a state of zero-stress in FIG. 7, for example, and thus it was approximated with a straight line passing the origin to obtain $A_{SIV\_st}$. $A_{SIV\_gb}$ was similarly obtained based on FIG. 9. In addition, $A_{SIV\_in}$ was obtained based on FIG. 8 by subtracting $A_{SIV\_st}$ and $A_{SIV\_gb}$ from $A_{SIV}$, and setting the subtracted value to be y-intercept of $A_{SIV\_in}$ (at the time of surface treatment time $t_s=0$ sec.).

(Formula 8)

$$A_{SIV\_st} = 3.22E\text{-}19 \times S \quad (8)$$

(Formula 9)

$$A_{SIV\_gb} = 2.80E\text{-}17 \times \sigma \quad (9)$$

(Formula 10)

$$A_{SIV\_in} = -4.00e\text{-}18 \times t_s + 2.57E\text{-}16$$

$$(A_{SIV\_in} \approx 0 \text{ WHEN } t_s \geq 64.25 \text{ sec.}) \quad (10)$$

Formula 8, formula 9, and formula 10 are substituted into formula 5 to obtain the following formulas:

(formula 11) (11)
(IN CASE OF $t_s < 64.25$ sec.)

$$erf\left(\frac{x_{open}}{2\sqrt{\begin{array}{l}((3.22E-19)\cdot S + (2.80E-17)\cdot \\ \sigma + (-4.00E-18)\cdot t_s + \\ (2.57E-16))\exp(\cdot \\ 0.001(T-150)^2)t_{open}\end{array}}}\right) = 1.43E\text{-}3$$

(formula 12) (12)
(IN CASE OF $t_s \geq 64.25$ sec.)

$$erf\left(\frac{x_{open}}{2\sqrt{((3.22E-19)\cdot S + (2.80E-17)\cdot \sigma)\exp(-0.001\cdot (T-150)^2)t_{open}}}\right) = 1.43E\text{-}3$$

The buried depth h and the via diameter d required for obtaining the time $t_{open}$ for ensuring the SIV test at a temperature T can be. calculated by substituting the interconnect parameters (stress S, surface treatment time $t_s$, area ratio σ) into formula 11 or formula 12.

Further, when the buried depth h and the via diameter d of via 124 are determined by a certain specification, an SIV-ensured time $t_{open}$ at temperature T can be calculated.

FIRST EMBODIMENT

Figure 10:
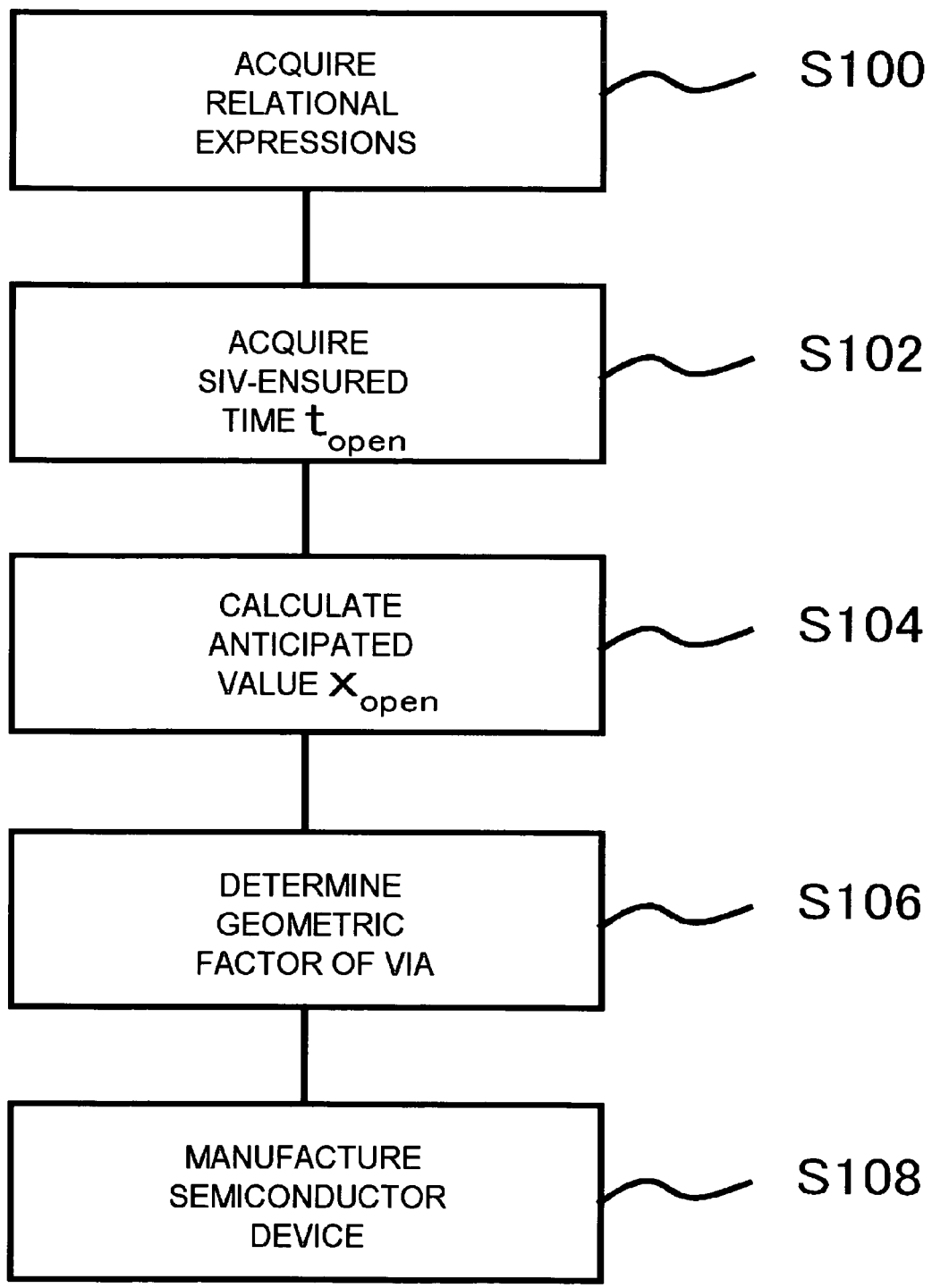
FIG. 10 is a flow chart, showing a procedure of designing the semiconductor device in an embodiment.

FIG. 10 is a flow chart, showing a procedure of designing the semiconductor device 100 in the present embodiment.

First, relational expressions shown in formula 11 and formula 12 are acquired (S100). Subsequently, a target SIV-ensured time $t_{open}$ is acquired (S102). Then, $t_{open}$ acquired in step S102 is substituted into the relational expressions to acquire an anticipated value $x_{open}$ (S104). Here, values of stress S and/or Cu<111>/<100> area ratio σ can be controlled by appropriately controlling the conditions for manufacturing the semiconductor device. The interconnect parameters are determined by the conditions for manufacturing the semiconductor device. The interconnect parameters are substituted into formula 11 or formula 12 to obtain the anticipated value $x_{open}$. Subsequently, a geometric factor of the via is determined based on the anticipated value $x_{open}$ (S106). For example, a geometric factor of the via is determined so as to satisfy the relationship of: d+2 h≧anticipated value $x_{open}$. Thereafter, the semiconductor device is manufactured so as to satisfy the geometric factor of the via designed in step S106 (S108).

FIG. 11A to FIG. 11E, FIG. 12A to FIG. 12E and FIG. 13 are cross-sectional views, showing a procedure for manufacturing a semiconductor device. In this case, an exemplary implementation of forming an interconnect of a semiconductor device by a single damascene process will be described.

Figure 11A:
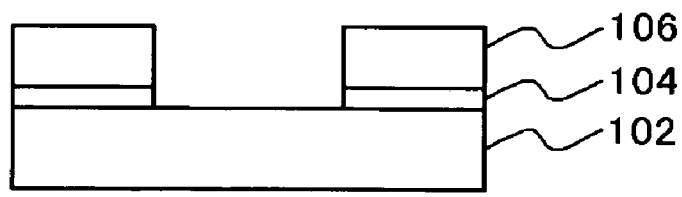
FIG. 11A to FIG. 11E are cross-sectional views, showing a procedure for manufacturing a semiconductor device.

First, an etch stop film 104 and an insulating film 106 are deposited on an insulating film 102 on a silicon substrate (not shown), and a resist film (not shown) patterned in a predetermined geometry is provided thereon, and then, the etch stop film 104 and the insulating film 106 are stepwise etched to form an interconnect trench (FIG. 11A).

Figure 11B:
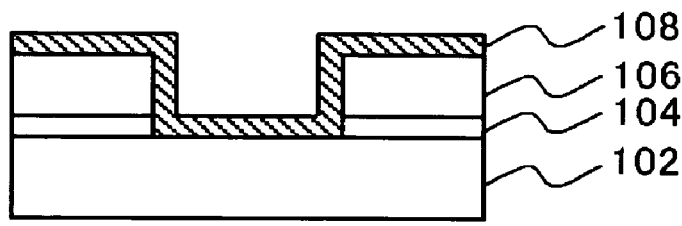

Then, a barrier metal film 108 is formed on the entire surface of the substrate via a sputtering process (FIG. 11B).

Figure 11C:
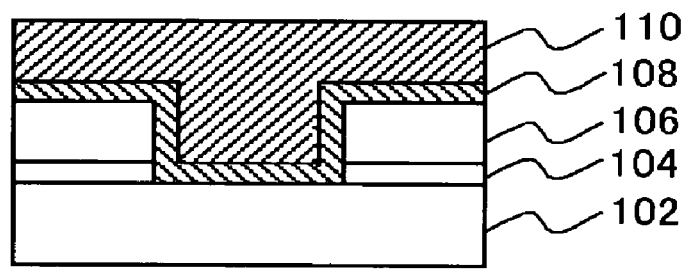

Thereafter, an interconnect metallic film 110 is formed on the barrier metal film 108 (FIG. 11C). In the present embodiment, the interconnect metallic film 110 may be composed of copper. The interconnect metallic film 110 may be formed by, for example, an electrolytic plating process. Conditions of the process for forming the interconnect metallic film 110 may be suitably controlled to provide an appropriately control of Cu<111>/<100> area ratio σ. As such, the formation of the interconnect metallic film 110 by the plating process provide a boundary on the surface of the interconnect metallic film 110, leading to easily generate a stress migration. Therefore, it is highly required to provide a design of semiconductor device in consideration of the SIV-ensured time in such case.

Subsequently, the substrate having the interconnect metallic film 110 formed thereon is thermally processed within an atmosphere of an inert gas such as Ar and nitrogen.

Figure 11D:
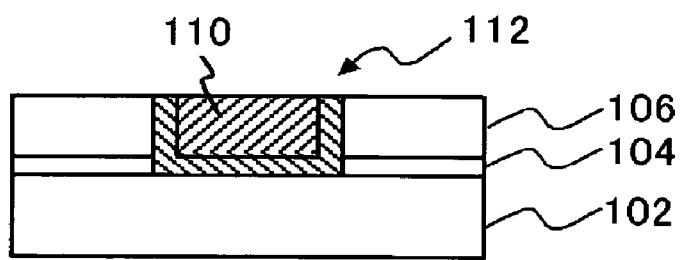
Figure 11E:
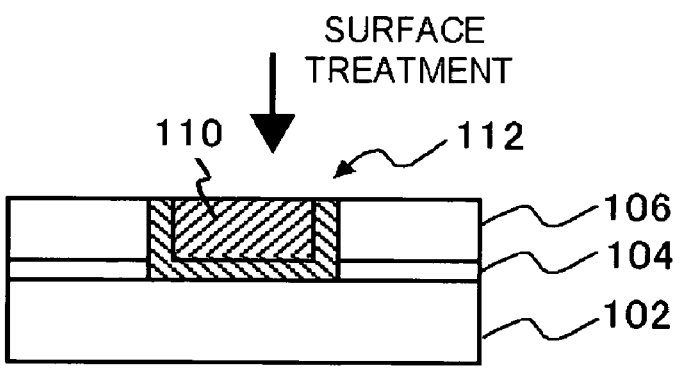

Next, unwanted portions of the interconnect metallic film 110 and the barrier metal film 108 located outside the interconnect trench are removed by a chemical mechanical polishing (CMP) to leave the barrier metal film 108 and the interconnect metallic film 110 only within the interconnect trench, thereby forming a first interconnect 112 (FIG. 11D).

Subsequently, the surface treatment of the first interconnect 112 is conducted. The surface treatment may be, for example, silane-exposure or ammonia-exposure. Having this configuration, number of grain boundaries in the interconnect metallic film 110 of first interconnect 112 can be reduced, thereby providing an improved stress migration resistance.

Figure 12A:
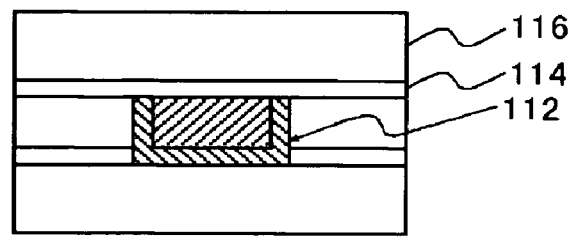
FIG. 12A to FIG. 12E are cross-sectional views, showing the procedure for manufacturing the semiconductor device.
Figure 12B:
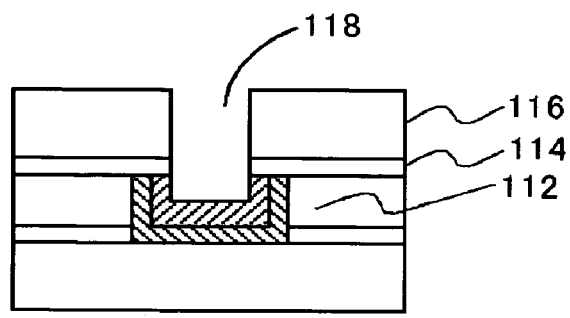

Thereafter, an etch stop film 114 and an insulating film 116 are deposited on the first interconnect 112 (FIG. 12A).

Subsequently, a via hole is formed so that the formed via satisfies a geometric factor designed in step S106 of FIG. 10. First, the insulating film 116 is etched by employing a lithography process until the etch stop film 114 is exposed, taking the opening diameter as the predetermined width d, and thereafter, the etch stop film 114 is etched by employing different etching gas to expose the upper surface of the first interconnect 112, and further, the first interconnect 112 is dug by only a predetermined depth h. Having such procedure, a via hole 118 is formed as show in FIG. 12B.

Figure 12C:
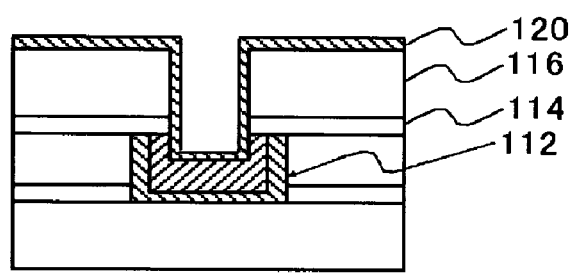
Figure 12D:
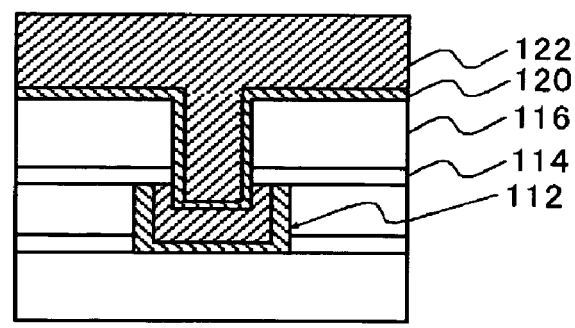
Figure 12E:
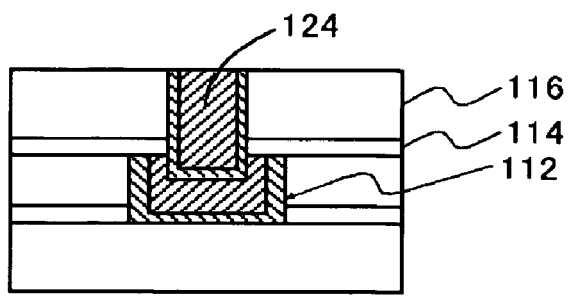

Then, a barrier metal film 120 is formed so as to plug the interior of the via hole 118 therewith (FIG. 12C). Subsequently, a via metallic film 122 is formed by an electrolytic plating process on the barrier metal film 120, similarly as in the formation of the first interconnect 112 (FIG. 12D). Then, a planarization thereof is conducted by CMP to form a via 124 (FIG. 12E).

Figure 13:
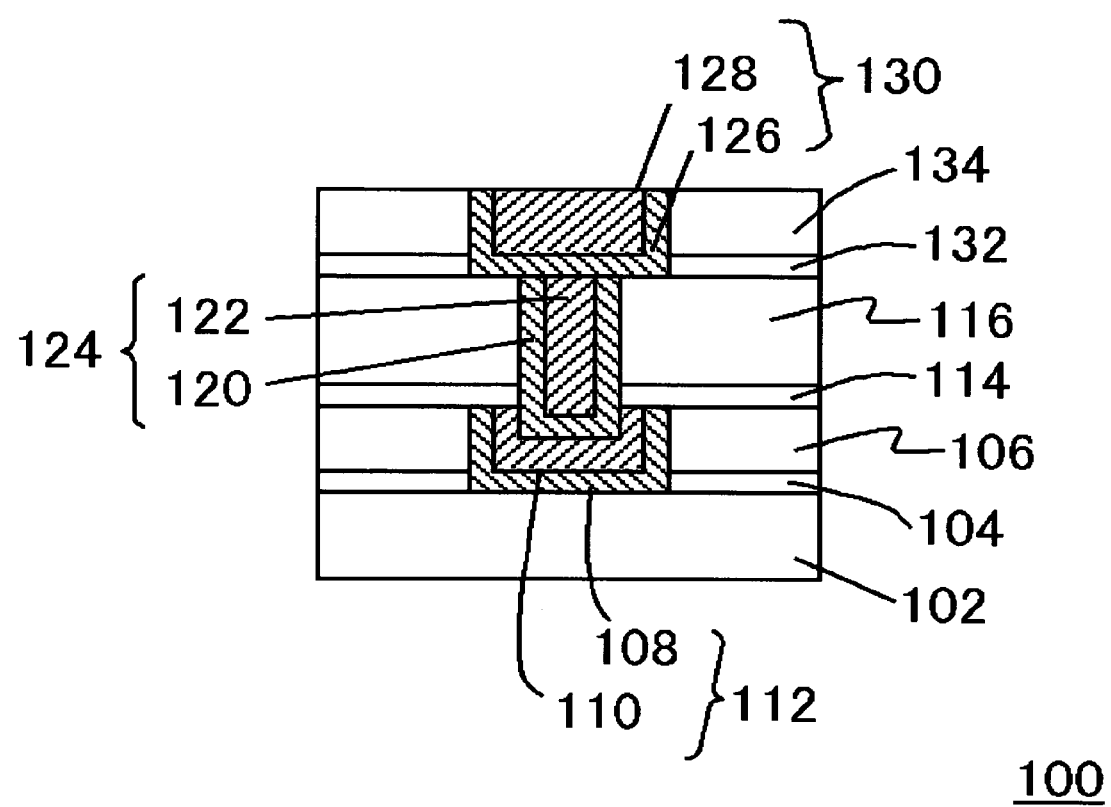
FIG. 13 is a cross-sectional view, showing the procedure for manufacturing the semiconductor device.

Subsequently, an etch stop film 132 and an insulating film 134 are deposited on the upper portion of the via 124, and then, an interconnect trench (not shown) is formed by a dry etching, and a barrier metal film 126 and an interconnect metallic film 128 are formed in this order, so as to plug the interior thereof. The interconnect metallic film 128 is deposited in a similar process as employed for depositing the interconnect metallic film 110 of the first interconnect 112. Thereafter, a planarization is conducted by CMP to form a second interconnect 130. The interconnect structure shown in FIG. 13 is formed as described above. Hereafter, the processes stated above are repeated to form a semiconductor device having the multiple-layered interconnect structure including three or more layers.

In the above-mentioned configuration, the insulating film 106 and the insulating film 134 may be composed of low dielectric constant films such as methyl silsesquioxane (MSQ), aromatic compound-containing organic material and the like. Here, the low dielectric constant film may be composed of a material having a relative dielectric constant of equal to or lower than 3.3. While the insulating film 102 and the insulating film 116 may be composed of silicon oxide films, these films may also be composed of low dielectric constant films, similarly as the insulating film 106 and the insulating film 134. The etch stop film 104, the etch stop film 114 and the etch stop film 132 may be composed of SiN, SiCN, SiOC or the like. The barrier metal film 108, the barrier metal film 120 and the barrier metal film 126 may be, for example, a tantalum-containing barrier metal having a multiple-layered structure of Ta and TaN.

For example, in the interconnect structure shown in FIG. 13, a geometric factor of via 124 having the following configurations is determined. The interconnect metallic film 110, the via metallic film 122 and the interconnect metallic film 128 are composed of cupper. Dimensions of the first interconnect 112 and the second interconnect 130 are 10 μm in width, 20 μm in length and 0.25 μm in height. The barrier metal film 108, the barrier metal film 120 and the barrier metal film 126 are tantalum-containing barrier metals having multiple-layered structures of Ta and TaN. Dimensions of the via 124 are: via diameter d=80 nm; and buried depth h=25 nm. The insulating film 106, the insulating film 116 and the insulating film 134 are composed of MSQ, which are low dielectric constant films. The etch stop film 104, the etch stop film 114 and the etch stop film 132 are composed of SiN films. Further, the surface treatment time $t_s$ for the first interconnect 112 is set to 90 seconds. Cu<111>/<100> area ratio σ of the first interconnect 112 is set to 0.001, and stress S is set to 1 MPa.

The value of $x_{open}$ is obtained from the relational expressions under these conditions, assuming that the SIV-ensured time $t_{open}$ at 150 degree C. was: $t_{open}$=10 years, to present the value of $X_{open}$ as: $X_{open}$=125 nm. The conditions $X_{open}$=d+2 h and d=80 nm provide a calculated result of h=22.5 nm.

As demonstrated in examples that will be discussed later, the SIV-ensured term $t_{open}$ of the semiconductor device 100 designed by using formula 11 or formula 12 substantially agree with experimental result. In other words, a semiconductor device that presents a desired SIV-ensured term $t_{open}$ can be obtained by determining the geometric factor of the via 124 using the above-described relational expressions.

Figure 14:
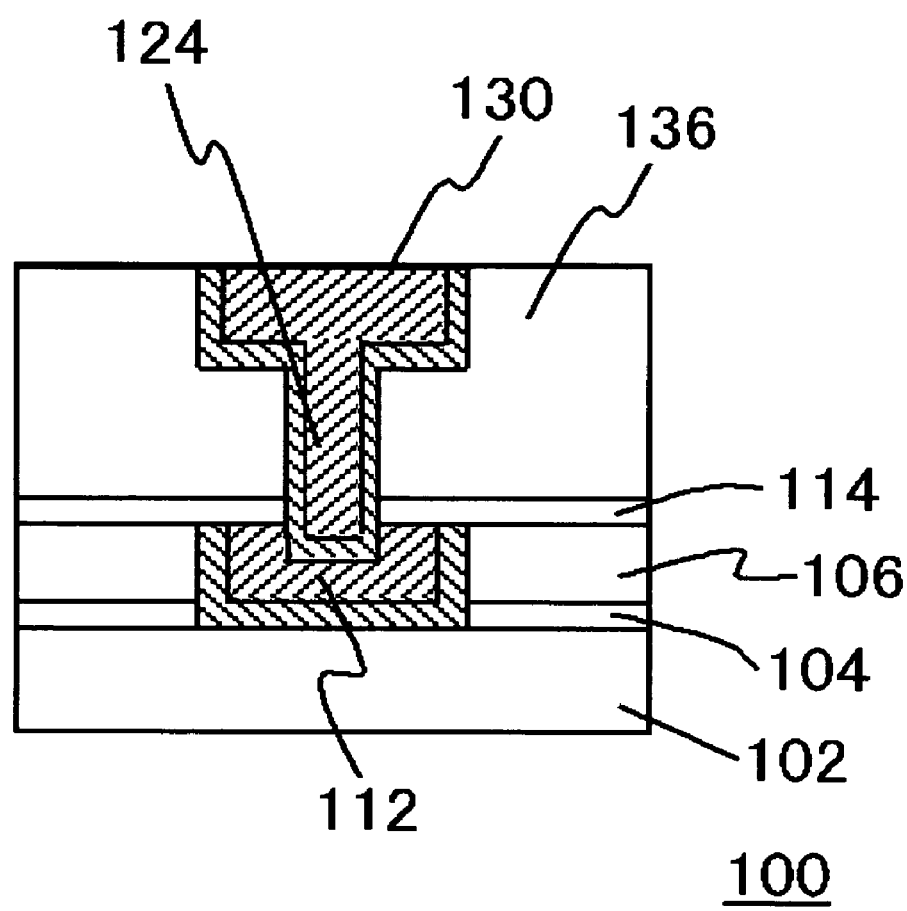
FIG. 14 is a cross-sectional view, schematically showing a configuration having an interconnect of a semiconductor device formed by a dual damascene process.

FIG. 14 is a cross-sectional view, schematically showing a configuration having an interconnect of a semiconductor device formed by a dual damascene process. A semiconductor device 100 include an insulating film 102 formed on a silicon substrate (not shown), an etch stop film 104 formed thereon, an insulating film 106 formed thereon, an etch stop film 114 formed thereon and an insulating film 136 formed thereon. A first interconnect 112 is formed in the insulating film 106. Further, a via 124 and a second interconnect 130 are formed on the first interconnect 112.

As such, the present invention can be applied in the case where the interconnect structure is formed via the dual damascene process, similarly in the case of forming thereof via the single damascene process stated above.

SECOND EMBODIMENT

Figure 15:
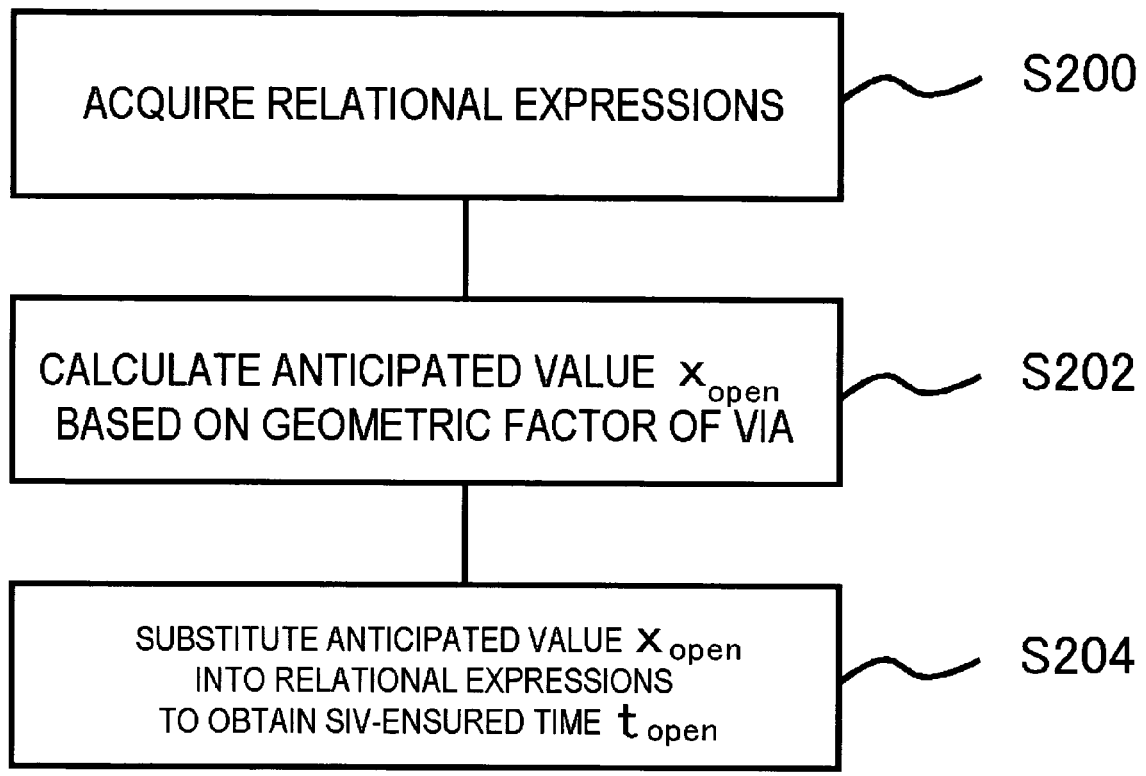
FIG. 15 is a flow chart, showing a procedure for calculating the SIV-ensured time $t_{open}$ in an embodiment.

FIG. 15 is a flow chart, showing a procedure for calculating the SIV-ensured time $t_{open}$ in the present embodiment. First, relational expressions shown in formula 11 and formula 12 are acquired (S200). Subsequently, an anticipated value $x_{open}$ is calculated based on characteristics of the via geometry of the semiconductor device to be manufactured (S202). Here, the anticipated value $x_{open}$ is calculated so as to satisfy the relationship of: anticipated value $x_{open}$≦d+2 h, for example. Then, the anticipated value $x_{open}$ and the interconnect parameters are substituted into the relational expressions to obtain the calculated result of the SIV-ensured time $t_{open}$ (S204). Here, values of stress S and/or Cu<111>/<100> area ratio σ can be controlled by appropriately controlling the conditions for manufacturing the semiconductor device. The interconnect parameters are determined by the conditions for manufacturing the semiconductor device.

For example, in the interconnect structure shown in FIG. 13, SIV-ensured time $t_{open}$ of the structure having the following configuration is calculated. The interconnect metallic film 110, the via metallic film 122 and the interconnect metallic film 128 are composed of cupper. Dimensions of the first interconnect 112 and the second interconnect 130 are 10 μm in width, 20 μm in length and 0.25 μm in height. The barrier metal film 108, the barrier metal film 120 and the barrier metal film 126 are tantalum-containing barrier metals having multiple-layered structures of Ta and TaN. Dimensions of the via 124 are: via diameter d=150 nm; and buried depth h=25 nm. The insulating film 106, the insulating film 116 and the insulating film 134 are composed of MSQ, which are low dielectric constant films. The etch stop film 104, the etch stop film 114 and the etch stop film 132 are composed of SiN films. Further, the surface treatment time $t_s$ for the first interconnect 112 is set to 90 seconds. Cu <111>/<100> area ratio σ of the first interconnect 112 is set to 0.001, and stress S is set to 1 MPa.

Here, the diffusion length x of the void is presented as: X =d+2 h=200 nm. This value is substituted into the relational expressions to present a calculated value of the SIV-ensured time $t_{open}$ within a temperature-atmosphere of 150 degree C. as: 23 years.

As demonstrated in examples that will be discussed later, the SIV-ensured term $t_{open}$ calculated by using the relational expressions described in embodiments substantially agree with experimental result. In other words, the SIV-ensured time $t_{open}$ having higher accuracy can be calculated by substituting the conditions into the relational expressions without actually conducting the SIV test. This provide conducting the reliability evaluation of the semiconductor device with an improved accuracy.

THIRD EMBODIMENT

In the present embodiment, configurations of systems for conducting a process for calculating a geometric factor of a via described in first embodiment and a process for calculating an SIV-ensured time $t_{open}$ described in second embodiment will be described.

Figure 16:
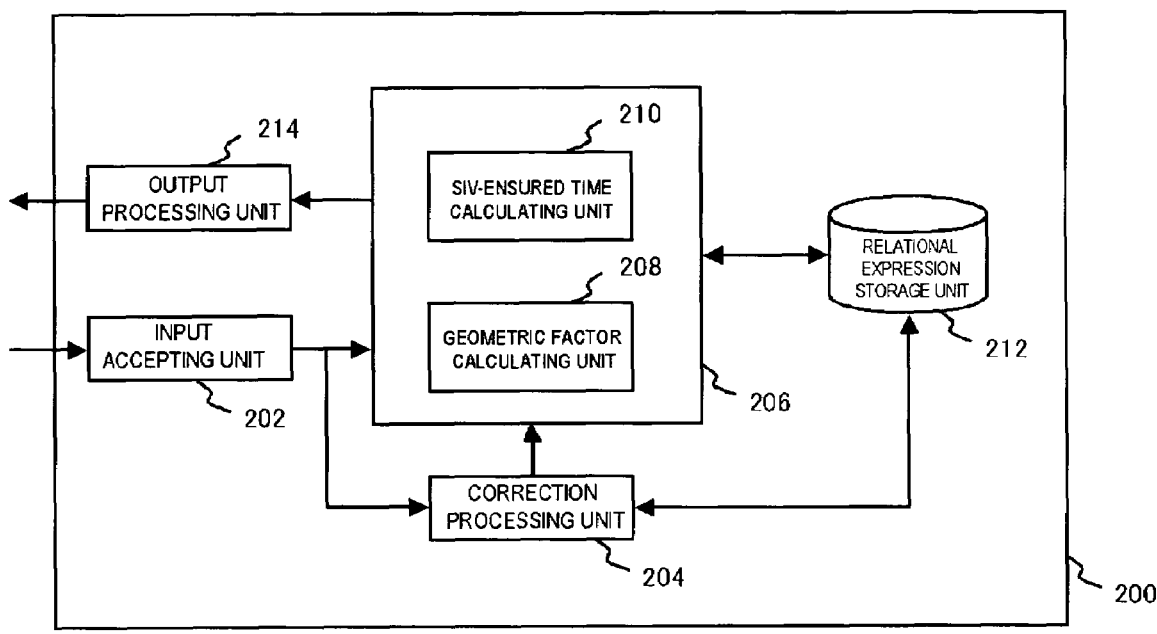
FIG. 16 is a block diagram, showing a configuration of designing/evaluating apparatus.
Figure 17:
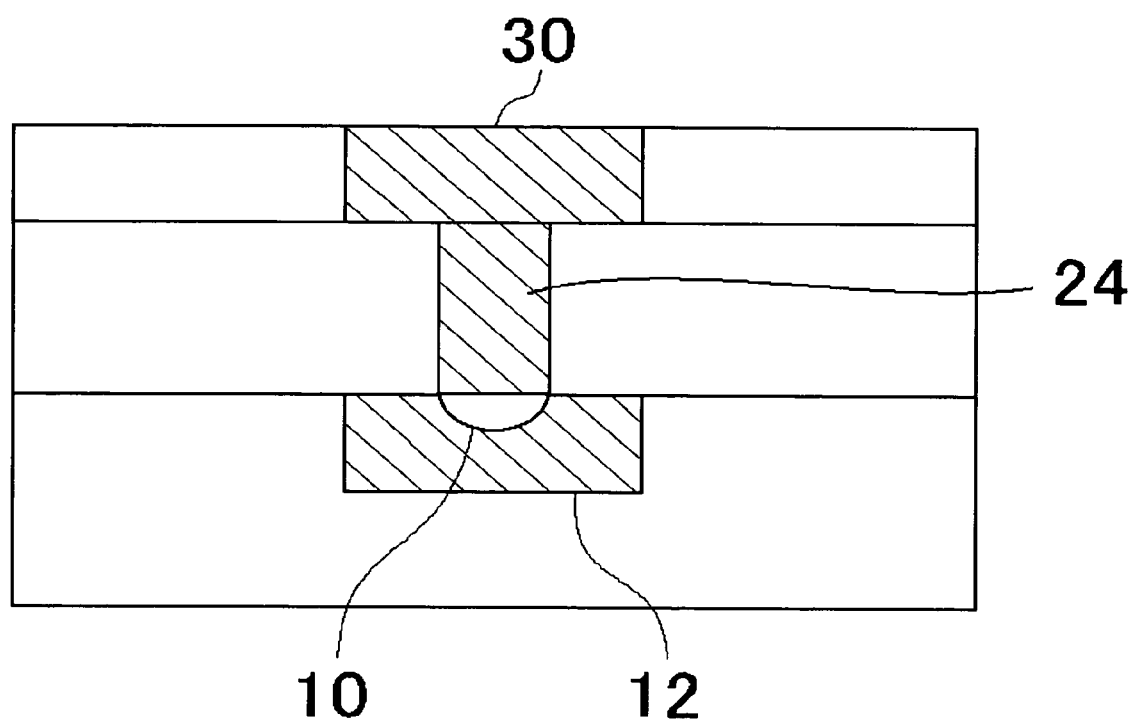
FIG. 17 is a schematic cross sectional view of a general copper multiple-layered interconnect formed via a damascene process.

FIG. 16 is a block diagram, showing a configuration of designing/evaluating apparatus 200. The designing/evaluating apparatus 200 include an input accepting unit 202, a correction processing unit 204, a calculation processing unit 206, a relational expression storage unit 212 and an output processing unit 214. The calculation processing unit 206 include a geometric factor calculating unit 208 and an SIV-ensured time calculating unit 210.

The relational expression storage unit 212 stores the relational expressions presented in formula 11 and formula 12 and/or values of the interconnect parameters in a certain manufacturing condition. The input accepting unit 202 accepts an indication from a user.

Functions in conducting a calculation of a geometric factor of a via with the designing/evaluating apparatus 200 will be described as follows. The input accepting unit 202 accepts an input of a target SIV-ensured time $t_{open}$. The input accepting unit 202 also accepts an input of a manufacturing condition. The correction processing unit 204 reads out interconnect parameters from the relational expression storage unit 212 based on the manufacturing condition that input accepting unit 202 has accepted and input them into the geometric factor calculating unit 208 of the calculation processing unit 206. The geometric factor calculating unit 208 reads out a pertinent relational expression from the relational expression storage unit 212, and substitutes the SIV-ensured time $t_{open}$ that the input accepting unit 202 has accepted and the interconnect parameter that the correction processing unit 204 has read out into the relational expressions to provide a calculated geometric factor. In this case, the geometric factor is an anticipated value $x_{open}$. The output processing unit 214 outputs the geometric factor calculated in the geometric factor calculating unit 208 to an external monitor or the like.

Next, functions in the case that the designing/evaluating apparatus 200 calculates the SIV-ensured time $t_{open}$ will be described. The input accepting unit 202 accepts an input of a parameter of the via geometry of the semiconductor device to be manufactured. In this case, the geometric factor is an anticipated value $x_{open}$. The input accepting unit 202 also accepts an input of a manufacturing condition. The correction processing unit 204 read out interconnect parameters from the relational expression storage unit 212 based on the manufacturing condition that input accepting unit 202 has accepted and input them into the SIV-ensured time calculating unit 210 of the calculation processing unit 206. The SIV-ensured time calculating unit 210 reads out a pertinent relational expression from the relational expression storage unit 212, and substitutes the anticipated value $x_{open}$ that the input accepting unit 202 has accepted and the interconnect parameter that the correction processing unit 204 has read out into the relational expressions to provide a calculated the SIV-ensured time $t_{open}$. The output processing unit 214 outputs the SIV-ensured time $t_{open}$ calculated in the SIV-ensured time calculating unit 210 to an external monitor or the like.

EXAMPLES

In example 1 to example 7, a target SIV-ensured time $t_{open}$ was substituted into a relational expression to conduct a calculation of a geometric factor of a via as described in first embodiment, and a semiconductor device was manufactured based on the design. Thereafter, an SIV test of the manufactured semiconductor device was conducted to measure an actual SIV-ensured time.

Example 1

Here, an example of calculating a buried depth h of a case having a fixed diameter d of the via is illustrated. An interconnect structure shown in FIG. 13 was formed. The interconnect metallic film 110, the via metallic film 122 and the interconnect metallic film 128 were composed of cupper. The barrier metal film 108, the barrier metal film 120 and the barrier metal film 126 were tantalum-containing barrier metals having multiple-layered structures of Ta and TaN. Dimensions of the first interconnect 112 and the second interconnect 130 were 10 μm in width, 20 μm in length and 0.25 μm in height. The diameter of the via 124 was: via diameter d=200 nm. The insulating film 106, the insulating film 116 and the insulating film 134 were composed of fluorinated silica glass (FSG) films. The etch stop film 104, the etch stop film 114 and the etch stop film 132 were composed of SiN films. Further, the surface treatment time $t_s$ for the first interconnect 112 was set to 90 seconds. In addition, Cu <111>/<100> area ratio σ of the first interconnect 112 was set to 0.01, and stress S was set to 315 MPa.

The value of $x_{open}$ was calculated using formula 11 or formula 12, assuming that the SIV-ensured time $t_{open}$ of an interconnect structure formed under these conditions was 1,000 hours at 150 degree C. Here, the terms of $A_{SIV\_in}$ and $A_{SIV\_gb}$ were neglected, as these were two or more orders of magnitude lower than that of the term of $A_{SIV\_st}$, and the $x_{open}$ was calculated by using $A_{SIV\_st}$ only. As a result, $x_{open}$ was obtained as: $x_{open}$=240 nm. From the value of: d=200 nm, and the relationship of: $x_{open}$=d+2 h, the above-described SIV test time $t_{open}$ can be satisfied by setting the height h as: h≧20 nm.

Consequently, the interconnect structure was formed by selecting the buried depth h of via hole 118 as: h=20 nm. Test element group (TEG) of 10,000 chains were formed, as forming: from a pad portion to a second interconnect, to a via, to a first interconnect, to a via, to a second interconnect . . . , to a pad, and the SIV test of the TEG was conducted within a temperature atmosphere of 150 degree C. Electric current was applied thereto in every ten hours in the SIV test, and it was determined that the open failure was occurred at the time when the resistance per one via exceeded 1 MΩ. As a result, an open failure was found after passing 1,010 hours, and thus it was clarified that the measured SIV-ensured time was almost equivalent to the anticipated SIV-ensured time of 1,000 hours.

Example 2

An interconnect structure shown in FIG. 13 was formed. The diameter of the via 124 was: via diameter d=130 nm. The insulating film 106, the insulating film 116 and the insulating film 134 were composed of MSQ, which are low dielectric constant films. Further, the surface treatment time $t_s$ for the first interconnect 112 was set to 30 seconds. Cu<111>/<100> area ratio σ was set to 0.01, and stress S was set to 1 MPa. All conditions except the above-described conditions were selected to be similar as in example 1.

The value of $x_{open}$ was calculated using relational expression under these conditions, assuming that the SIV-ensured time $t_{open}$ was 500 hours at 150 degree C. Here, the terms of $A_{SIV\_st}$ and $A_{SIV\_gb}$ were neglected, as these were two or more orders of magnitude lower than that of the term of $A_{SIV\_in}$, and the value of $x_{open}$ was calculated by using $A_{SIV\_in}$ only. As a result, $x_{open}$ was obtained as: $x_{open}$=200 nm. Since the value of d was: d=130 nm, the above-described SIV test time $t_{open}$ can be satisfied by setting the height h as: h≧35 nm.

Consequently, the interconnect structure was formed by selecting the buried depth h of via hole 118 as: h=35 nm. TEG of 10,000 chains were formed, as forming: from a pad portion to a second interconnect, to a via, to a first interconnect, to a via, to a second interconnect . . . , to a pad, and the SIV test of the TEG was conducted within a temperature atmosphere of 150 degree C. Electric current was applied thereto in every ten hours in the SIV test, and it was determined that the open failure was occurred at the time when the resistance per one via exceeded 1 MΩ. As a result, an open failure was found after passing 540 hours, and the measured SIV-ensured time was nearly equivalent to the anticipated SIV-ensured time of 500 hours, and even better result was obtained as compared with the assumed SIV-ensured time of 500 hours.

Example 3

An interconnect structure shown in FIG. 13 was formed. The insulating film 106, the insulating film 116 and the insulating film 134 were composed of MSQ, which are low dielectric constant films. Cu <111>/<100> area ratio σ was set to 10, and stress S was set to 1 MPa. All conditions except the above-described conditions were selected to be similar as in example 1.

The value of $x_{open}$ was calculated using relational expression under these conditions, assuming that the SIV-ensured time $t_{open}$ was 1,000 hours at 175 degree C. Here, the terms of $A_{SIV\_st}$ and $A_{SIV\_in}$ were neglected, as these were two or more orders of magnitude lower than that of the term of $A_{SIV\_gb}$, and the value of $x_{open}$ was calculated by using $A_{SIV\_gb}$ only. As a result, $x_{open}$ was obtained as: $x_{open}$=310 nm. Since the value of d was: d=200 nm, the above-described SIV test time $t_{open}$ can be satisfied by setting the height h as: h≧55 nm.

Consequently, the interconnect structure was formed by selecting the buried depth h of via hole 118 as: h=55 nm. TEG of 10,000 chains were formed, as forming: from a pad portion to a second interconnect, to a via, to a first interconnect, to a via, to a second interconnect . . . , to a pad, and the SIV test of the TEG was conducted within a temperature atmosphere of 175 degree C. Electric current was applied thereto in every ten hours in the SIV test, and it was determined that the open failure was occurred at the time when the resistance per one via exceeded 1 MΩ. As a result, an open failure was found after passing 1,130 hours, and the measured SIV-ensured time was nearly equivalent to the anticipated SIV-ensured time of 1,000 hours, and even better result was obtained as compared with the assumed SIV-ensured time of 1,000 hours.

Example 4

An interconnect structure shown in FIG. 13 was formed. The insulating film 106, the insulating film 116 and the insulating film 134 were composed of borosilicate glass (BSG) films. Further, the surface treatment time $t_s$ for the first interconnect 112 was set to 30 seconds. Cu <111>/<100> area ratio σ was set to 0.01, and stress S was set to 250 MPa. All conditions except the above-described conditions were selected to be similar as in example 1.

The value of $x_{open}$ was calculated using relational expression under these conditions, assuming that the SIV-ensured time $t_{open}$ was 1,000 hours at 150 degree C. Here, the term of $A_{SIV\_gb}$ was neglected, as this was two or more orders of magnitude lower than that of the terms of $A_{SIV\_st}$, $A_{SIV\_in}$, and the value of $x_{open}$ was calculated by using $A_{SIV\_st}$ and $A_{SIV\_in}$. As a result, $x_{open}$ was obtained as: $x_{open}$=360 nm. Since the value of d was: d=200 nm, the above-described SIV test time $t_{open}$ can be satisfied by setting the height h as: h≧80 nm.

Consequently, the interconnect structure was formed by selecting the buried depth h of via hole 118 as: h=80 nm. TEG of 10,000 chains were formed, as forming: from a pad portion to a second interconnect, to a via, to a first interconnect, to a via, to a second interconnect . . . , to a pad, and the SIV test of the TEG was conducted within a temperature atmosphere of 150 degree C. Electric current was applied thereto in every ten hours in the SIV test, and it was determined that the open failure was occurred at the time when the resistance per one via exceeded 1 MΩ. As a result, an open failure was found after passing 1,040 hours, and thus it was clarified that the measured SIV-ensured time was almost equivalent to the anticipated SIV-ensured time of 1,000 hours.

Example 5

An interconnect structure shown in FIG. 13 was formed. The diameter of the via 124 was: via diameter d=220 nm. The insulating film 106, the insulating film 116 and the insulating film 134 were composed of MSQ, which are low dielectric constant films. Further, the surface treatment time $t_s$ for the first interconnect 112 was set to 45 seconds. Cu <111>/<100> area ratio σ was set to 7, and stress S was set to 1 MPa. All conditions except the above-described conditions were selected to be similar as in example 1.

The value of $x_{open}$ was calculated using relational expression under these conditions, assuming that the SIV-ensured time $t_{open}$ was 500 hours at 150 degree C. Here, the term of $A_{SIV\_st}$ was neglected, as this was two or more orders of magnitude lower than that of the terms of $A_{SIV\_gb}$, $A_{SIV\_in}$, and the value of $x_{open}$ was calculated by using $A_{SIV\_gb}$ and $A_{SIV\_in}$. As a result, $x_{open}$ was obtained as: $x_{open}$=320 nm. Since the value of d was: d=220 nm, the above-described SIV test time $t_{open}$ can be satisfied by setting the height h as: h≧50 nm.

Consequently, the interconnect structure was formed by selecting the buried depth h of via hole 118 as: h=50 nm. TEG of 10,000 chains were formed, as forming: from a pad portion to a second interconnect, to a via, to a first interconnect, to a via, to a second interconnect . . . , to a pad, and the SIV test of the TEG was conducted within a temperature atmosphere of 150 degree C. Electric current was applied thereto in every ten hours in the SIV test, and it was determined that the open failure was occurred at the time when the resistance per one via exceeded 1 MΩ. As a result, an open failure was found after passing 570 hours, and the measured SIV-ensured time was nearly equivalent to the anticipated SIV-ensured time of 500 hours, and even better result was obtained as compared with the assumed SIV-ensured time of 500 hours.

Example 6

An interconnect structure shown in FIG. 13 was formed. The insulating film 106, the insulating film 116 and the insulating film 134 were composed of BSG films. Cu <111>/<100> area ratio σ was set to 15, and stress S was set to 510 MPa. All conditions except the above-described conditions were selected to be similar as in example 1.

The value of $x_{open}$ was calculated using relational expression under these conditions, assuming that the SIV-ensured time $t_{open}$ was 300 hours at 150 degree C. Here, the term of $A_{SIV\_in}$ was neglected, as this was two or more orders of magnitude lower than that of the terms of $A_{SIV\_gb}$ or $A_{SIV\_st}$, and the value of $x_{open}$ was calculated by using $A_{SIV\_gb}$ and $A_{SIV\_st}$. As a result, $x_{open}$ was obtained as: $x_{open}$=320 nm. Since the value of d was: d=200 nm, the above-described SIV test time $t_{open}$ can be satisfied by setting the height h as: h≧60 nm.

Consequently, the interconnect structure was formed by selecting the buried depth h of via hole 118 as: h=60 nm. TEG of 10,000 chains were formed, as forming: from a pad portion to a second interconnect, to a via, to a first interconnect, to a via, to a second interconnect . . . , to a pad, and the SIV test of the TEG was conducted within a temperature atmosphere of 150 degree C. Electric current was applied thereto in every ten hours in the SIV test, and it was determined that the open failure was occurred at the time when the resistance per one via exceeded 1 MΩ. As a result, an open failure was found after passing 310 hours, and thus it was clarified that the measured SIV-ensured time was almost equivalent to the anticipated SIV-ensured time of 300 hours.

Example 7

An interconnect structure shown in FIG. 13 was formed. The insulating film 106, the insulating film 116 and the insulating film 134 were composed of BSG films. Further, the surface treatment time $t_s$ for the first interconnect 112 was set to 15 seconds. Cu <111>/<100> area ratio σ was set to 15, and stress S was set to 510 MPa. All conditions except the above-described conditions were selected to be similar as in example 1.

The value of $x_{open}$ was calculated using relational expression under these conditions, assuming that the SIV-ensured time $t_{open}$ was 250 hours at 150 degree C. As a result, $x_{open}$ was obtained as: $x_{open}$=340 nm. Since the value of d was: d=200 nm, the above-described SIV test time $t_{open}$ can be satisfied by setting the height h as: h≧70 nm.

Consequently, the interconnect structure was formed by selecting the buried depth h of via hole 118 as: h=75 nm. TEG of 10,000 chains were formed, as forming: from a pad portion to a second interconnect, to a via, to a first interconnect, to a via, to a second interconnect . . . , to a pad, and the SIV test of the TEG was conducted within a temperature atmosphere of 150 degree C. Electric current was applied thereto in every ten hours in the SIV test, and it was determined that the open failure was occurred at the time when the resistance per one via exceeded 1 MΩ. As a result, an open failure was found after passing 280 hours, and thus it was clarified that the measured SIV-ensured time was almost equivalent to the anticipated SIV-ensured time of 250 hours.

As described above, the SIV-ensured term $t_{open}$ of the semiconductor device 100 calculated by using the relational expressions of formula 11 or formula 12 described in embodiments substantially agree with experimental result. In other words, a semiconductor device that presents a desired SIV-ensured term $t_{open}$ can be obtained by determining the geometric factor of the via 124 using the above-described relational expressions.

In example 8 to example 16, a geometric factor of a via of a semiconductor device to be manufactured was substituted therein to conduct a calculation of SIV-ensured time $t_{open}$, as described in second embodiment. Thereafter, a semiconductor device was manufactured under the same condition, and an SIV test of the manufactured semiconductor device was conducted to measure an actual SIV-ensured time.

Example 8

An interconnect structure shown in FIG. 13 was formed. The interconnect metallic film 110, the via metallic film 122 and the interconnect metallic film 128 were composed of cupper. The barrier metal film 108, the barrier metal film 120 and the barrier metal film 126 were tantalum-containing barrier metals having multiple-layered structures of Ta and TaN. Dimensions of the first interconnect 112 and the second interconnect 130 were 10 μm in width, 20 μm in length and 0.25 μm in height. Dimensions of the via 124 were: via diameter d=200 nm; and buried depth h=50 nm. The insulating film 106, the insulating film 116 and the insulating film 134 were composed of MSQ, which are low dielectric constant films. The etch stop film 104, the etch stop film 114 and the etch stop film 132 were composed of SiN films. Further, the surface treatment time $t_s$ for the first interconnect 112 was set to 90 seconds. Cu <111>/<100> area ratio σ of the first interconnect 112 was set to 0.01, and stress S was set to 315 MPa.

Here, the SIV-ensured time $t_{open}$ was calculated with the relational expressions, substituting a relationship of: $x_{open}$=d +2 h therein. The terms of $A_{SIV\_in}$, $A_{SIV\_gb}$ were neglected, as these were two or more orders of magnitude lower than that of the term of $A_{SIV\_st}$, and the SIV-ensured time $t_{open}$ was calculated by using $A_{SIV\_st}$ only. As a result, the SIV-ensured time $t_{open}$ was obtained as: $t_{open}$=1,550 hours.

Test element group (TEG) of 10,000 chains were formed, as forming: from a pad portion of the interconnect structure of configuration described above to a second interconnect, to a via, to a first interconnect, to a via, to a second interconnect . . . , to a pad, and the SIV test of the TEG was conducted within a temperature atmosphere of 150 degree C. Electric current was applied thereto in every ten hours in the SIV test, and it was determined that the open failure was occurred at the time when the resistance per one via exceeded 1 MΩ. As a result, an open failure was found after passing 1,550 hours, and thus the measured SIV-ensured time was substantially equivalent to the calculated SIV-ensured time of 1,550 hours.

Example 9

An interconnect structure shown in FIG. 13 was formed. The surface treatment time $t_s$ was set to 30 seconds. Cu <111>/<100> area ratio σ was set to 0.01, and stress S was set to 1 MPa. All conditions except the above-described conditions were selected to be similar as in example 8.

Here, the SIV-ensured time $t_{open}$ was calculated with the relational expressions, substituting a relationship of: $x_{open}$=d+2 h therein. The terms of $A_{SIV\_st}$, $A_{SIV\_gb}$ were neglected, as these were two or more orders of magnitude lower than that of the term of $A_{SIV\_in}$, and the SIV-ensured time $t_{open}$ was calculated by using $A_{SIV\_in}$ only. As a result, the SIV-ensured time $t_{open}$ was obtained as: $t_{open}$=1,150 hours.

TEG of 10,000 chains were formed, as forming: from a pad portion of the interconnect structure of configuration described above to a second interconnect, to a via, to a first interconnect, to a via, to a second interconnect . . . , to a pad, and the SIV test of the TEG was conducted within a temperature atmosphere of 150 degree C. Electric current was applied thereto in every ten hours in the SIV test, and it was determined that the open failure was occurred at the time when the resistance per one via exceeded 1 MΩ. As a result, an open failure was found when a time, which is substantially equivalent to the calculated SIV-ensured time of 1,550 hours, had passed.

Example 10

An interconnect structure shown in FIG. 13 was formed. The surface treatment time $t_s$ was set to 90 seconds. Cu <111>/<100> area ratio σ was set to 10, and stress S was set to 1 MPa. All conditions except the above-described conditions were selected to be similar as in example 8.

Here, the SIV-ensured time $t_{open}$ was calculated with the relational expressions, substituting a relationship of: $x_{open}=d+2$ h therein. The terms of $A_{SIV\_st}$, $A_{SIV\_in}$ were neglected, as these were two or more orders of magnitude lower than that of the term of $A_{SIV\_gb}$, and the SIV-ensured time $t_{open}$ was calculated by using $A_{SIV\_gb}$ only. As a result, the SIV-ensured time $t_{open}$ was obtained as: $t_{open}=570$ hours.

TEG of 10,000 chains were formed, as forming: from a pad portion of the interconnect structure of configuration described above to a second interconnect, to a via, to a first interconnect, to a via, to a second interconnect . . . , to a pad, and the SIV test of the TEG was conducted within a temperature atmosphere of 150 degree C. Electric current was applied thereto in every ten hours in the SIV test, and it was determined that the open failure was occurred at the time when the resistance per one via exceeded 1 MΩ. As a result, an open failure was found when a time, which is substantially equivalent to the calculated SIV-ensured time of 570 hours, had passed.

Example 11

An interconnect structure shown in FIG. 13 was formed. The surface treatment time $t_s$ was set to 30 seconds. Cu <111>/<100> area ratio σ was set to 0.01, and stress S was set to 250 MPa. All conditions except the above-described conditions were selected to be similar as in example 8.

Here, the SIV-ensured time $t_{open}$ was calculated with the relational expressions, substituting a relationship of: $x_{open}=d+2$ h therein. The terms of $A_{SIV\_gb}$ was neglected, as these were two or more orders of magnitude lower than that of the term of $A_{SIV\_st}$, $A_{SIV\_in}$, and the SIV-ensured time $t_{open}$ was calculated by using $A_{SIV\_st}$ and $A_{SIV\_in}$. As a result, the SIV-ensured time $t_{open}$ was obtained as: $t_{open}=730$ hours.

TEG of 10,000 chains were formed, as forming: from a pad portion of the interconnect structure of configuration described above to a second interconnect, to a via, to a first interconnect, to a via, to a second interconnect . . . , to a pad, and the SIV test of the TEG was conducted within a temperature atmosphere of 150 degree C. Electric current was applied thereto in every ten hours in the SIV test, and it was determined that the open failure was occurred at the time when the resistance per one via exceeded 1 MΩ. As a result, an open failure was found when a time, which is substantially equivalent to the calculated SIV-ensured time of 730 hours, had passed.

Example 12

An interconnect structure shown in FIG. 13 was formed. The surface treatment time $t_s$ was set to 45 seconds. Cu <111>/<100> area ratio σ was set to 7, and stress S was set to 1 MPa. All conditions except the above-described conditions were selected to be similar as in example 8.

Here, the SIV-ensured time $t_{open}$ was calculated with the relational expressions, substituting a relationship of: $x_{open}=d+2$ h therein. The terms of $A_{SIV\_st}$ was neglected, as these were two or more orders of magnitude lower than that of the term of $A_{SIV\_gb}$, $A_{SIV\_in}$, and the SIV-ensured time $t_{open}$ was calculated by using $A_{SIV\_gb}$ and $A_{SIV\_in}$. As a result, the SIV-ensured time $t_{open}$ was obtained as: $t_{open}=580$ hours.

TEG of 10,000 chains were formed, as forming: from a pad portion of the interconnect structure of configuration described above to a second interconnect, to a via, to a first interconnect, to a via, to a second interconnect . . . , to a pad, and the SIV test of the TEG was conducted within a temperature atmosphere of 150 degree C. Electric current was applied thereto in every ten hours in the SIV test, and it was determined that the open failure was occurred at the time when the resistance per one via exceeded 1 MΩ. As a result, an open failure was found when a time, which is substantially equivalent to the calculated SIV-ensured time of 580 hours, had passed.

Example 13

An interconnect structure shown in FIG. 13 was formed. Cu <111>/<100> area ratio σ was set to 15, and stress S was set to 510 MPa. All conditions except the above-described conditions were selected to be similar as in example 8.

Here, the SIV-ensured time $t_{open}$ was calculated with the relational expressions, substituting a relationship of: $x_{open}=d+2$ h therein. The terms of $A_{SIV\_in}$ was neglected, as these were two or more orders of magnitude lower than that of the term of $A_{SIV\_gb}$, $A_{SIV\_st}$, and the SIV-ensured time $t_{open}$ was calculated by using $A_{SIV\_gb}$ and $A_{SIV\_st}$. As a result, the SIV-ensured time $t_{open}$ was obtained as: $t_{open}=270$ hours.

TEG of 10,000 chains were formed, as forming: from a pad portion of the interconnect structure of configuration described above to a second interconnect, to a via, to a first interconnect, to a via, to a second interconnect . . . , to a pad, and the SIV test of the TEG was conducted within a temperature atmosphere of 150 degree C. Electric current was applied thereto in every ten hours in the SIV test, and it was determined that the open failure was occurred at the time when the resistance per one via exceeded 1 MΩ. As a result, an open failure was found when a time, which is substantially equivalent to the calculated SIV-ensured time of 270 hours, had passed.

Example 14

An interconnect structure shown in FIG. 13 was formed. The surface treatment time $t_s$ was set to 15 seconds. Cu <111>/<100> area ratio σ was set to 15, and stress S was set to 510 MPa. All conditions except the above-described conditions were selected to be similar as in example 8.

Here, the SIV-ensured time $t_{open}$ was calculated with the relational expressions, substituting a relationship of: $x_{open}=d+2$ h therein. As a result, the SIV-ensured time $t_{open}$ was obtained as: $t_{open}=200$ hours.

TEG of 10,000 chains were formed, as forming: from a pad portion of the interconnect structure of configuration described above to a second interconnect, to a via, to a first interconnect, to a via, to a second interconnect . . . , to a pad, and the SIV test of the TEG was conducted within a temperature atmosphere of 150 degree C. Electric current was applied thereto in every ten hours in the SIV test, and it was determined that the open failure was occurred at the time when the resistance per one via exceeded 1 MΩ. As a result, an open failure was found when a time, which is substantially equivalent to the calculated SIV-ensured time of 200 hours, had passed.

As described above, the SIV-ensured term $t_{open}$ calculated by using the relational expressions of formula 11 and formula 12 described in embodiments substantially agree with experimental result. In other words, the SIV-ensured time $t_{open}$ having higher accuracy can be calculated by substituting the conditions into the relational expressions without actually conducting the SIV test. This provide conducting the reliability evaluation of the semiconductor device with an improved accuracy.

The present invention has been described on the basis of the preferred embodiments. It should be understood by a person having ordinary skills in the art that the present embodiments are disclosed for the purpose of the illustrations only, and the various changes or modifications in the combinations of the respective elements and/or the respective processes are available and are within the scope of the present invention.

While the above-described embodiments illustrate the relationship among the diffusion constants is: $D_{SIV} \approx D_{st} + D_{gb} + D_{in}$, as indicated in formula 2, the diffusion constant $D_{SIV}$ may also be obtained in consideration of any one of, or combination of any two of: the diffusion constant $D_{st}$, the diffusion constant $D_{gb}$ and the diffusion constant $D_{in}$. Even in such case, it may be preferable to obtain the diffusion constant $D_{SIV}$ in consideration of the diffusion constant $D_{st}$. Meanwhile, in the case of determining the geometric factor of the via or calculating the SIV-ensured time $t_{open}$ by using the calculated relational expressions in a similar way as the above-described, when any of the diffusion constant $D_{st}$, the diffusion constant $D_{gb}$ and the diffusion constant $D_{in}$ is/are considerably smaller as compared with other diffusion constants in the target semiconductor device, the smaller diffusion constant may be ignored.

While the above-mentioned embodiments illustrate exemplary implementations of comparing the dimension of the anticipated value of the growing region of the void with the dimension of the contacting region between the interconnect 112 and the first via 124 by utilizing lengths thereof as representing these dimensions, these comparisons may also conducted by employing areas calculated by using these length.

Further, while the above-described embodiments illustrate exemplary implementations of the calculations by two-dimensionally approximating the path length L from one end to the other end of the contacting region between the first interconnect 112 and the via 124 as d+2 h, the path length L may also be calculated by employing, for example, a three-dimensional approximation.

While the above-mentioned embodiments also illustrate procedures for manufacturing the semiconductor devices, these are disclosed for the purpose of the illustrations only, and the present invention may also equally be applicable to other semiconductor devices manufactured by various other manufacturing procedures. In addition, configurations of the semiconductor devices may also changes in various manner. Further, materials for respective components composing the semiconductor device may also changes in various manner. While the configuration of composing the interconnect metallic film 110 or the like with copper is illustrated in the above-mentioned embodiment, for example, the interconnect metallic film 110 or the like may also have a configuration to including different chemical elements such as Ag, for example, in addition to copper.

Further, while the above-described embodiments illustrate exemplary implementations of configurations where one via is coupled to one interconnect, a multi-via structure where a plurality of vias are coupled to one interconnect may also be applied to the present invention.

It is apparent that the present invention is not limited to the above embodiment, and may be modified and changed without departing from the scope and spirit of the invention.

What is claimed is:

1. A method for designing a semiconductor device including a structure that has a via formed on a copper interconnect, comprising:
   calculating an anticipated value $X_{open}$ of a dimension of a growing region of a void expanding in a stress induced voiding (SIV)-ensured time $t_{open}$ at a predetermined temperature, assuming that the void grows from an origin in said copper interconnect;
   determining a geometric factor of said via by comparing a dimension of a contacting region between said copper interconnect and said via with said anticipated value $X_{open}$; and
   designing the semiconductor device based on the determined geometric factor.

2. The method for designing the semiconductor device according to claim 1, wherein said determining the geometric factor of said via includes determining the geometric factor of said via so that the dimension of said contacting region is not smaller than said anticipated value $x_{open}$.

3. The method for designing the semiconductor device according to claim 2, wherein said calculating the anticipated value $x_{open}$ includes calculating a growth length of the void growing toward a direction in said SIV-ensured time $t_{open}$ at said predetermined temperature and assigning the calculated growth length to said anticipated value $x_{open}$, and wherein said determining the geometric factor of said via includes calculating a path length from one end to the other end of the contacting region, said path length representing the dimension of said contacting region, and determining the geometric factor of said via by comparing said path length with said anticipated value $x_{open}$.

4. The method for designing the semiconductor device according to claim 3, wherein, in said determining the geometric factor of said via, said geometric factor is determined by defining:

$$\text{said path long} = d + 2h$$

(where d is a diameter of said via, and h is a depth that said via is buried within said copper interconnect).

5. The method for designing the semiconductor device according to claim 1, wherein said calculating the anticipated value $x_{open}$ includes calculating a growth length of the void growing toward a direction in said SIV-ensured time $t_{open}$ at said predetermined temperature and assigning the calculated growth length to said anticipated value $x_{open}$, and wherein said determining the geometric factor of said via includes calculating a path length from one end to the other end of the contacting region, said path length representing the dimension of said contacting region, and determining the geometric factor of said via by comparing said path length with said anticipated value $x_{open}$.

6. The method for designing the semiconductor device according to claim 5, wherein, in said determining the geometric factor of said via, said geometric factor is determined by defining:

$$\text{said path long} = d + 2h$$

(where d is a diameter of said via, and h is a depth that said via is buried within said copper interconnect).

7. The method for designing the semiconductor device according to claim 1, wherein said calculating the anticipated value $x_{open}$ includes calculating said anticipated value $x_{open}$ by substituting said SIV-ensured time $t_{open}$ into a processing time t in a formula, said formula including variables of: said processing time t; an anticipated value x of the growing region of the void expanding in said processing time at said predetermined temperature; and an interconnect parameter D representing diffuse-ability of said void in said copper interconnect.

8. The method for designing the semiconductor device according to claim 7, wherein said interconnect parameter D is calculated on the basis of a parameter selected from a group consisting of: a tensile stress of said copper interconnect, an orientation of a surface of said copper interconnect, a time required for conducting a surface treatment of said copper interconnect, and a combination of two or more thereof.

9. A method for evaluating reliability of a semiconductor device including a structure that has a via formed on a copper interconnect, comprising:
calculating a dimension of a contacting region between said copper interconnect and said via on the basis of a geometric factor of said via;
calculating a stress induced voiding (SIV)-ensured time $t_{open}$ by comparing a dimension of said contacting region with an anticipated value x of a dimension of a growing region of a void expanding in a processing time t at a predetermined temperature, assuming that the void grows from an origin in said copper interconnect; and
providing the calculated stress induced voiding (SIV)-ensured time $t_{open}$ to a user.

10. The method for evaluating reliability of the semiconductor device according to claim 9, wherein said calculating the SIV-ensured time $t_{open}$ includes calculating the processing time t required for attaining said anticipated value x that is equal to or higher than the dimension of said contacting region to assign the calculated processing time t to said SIV-ensured time $t_{open}$.

11. The method for evaluating reliability of the semiconductor device according to claim 10, wherein said calculating the dimension of said contacting region includes calculating a path length from one end to the other end of the contacting region, and wherein said calculating the SIV-ensured time $t_{open}$ includes calculating a growth length of the void growing toward a direction in said processing time t at said predetermined temperature, assigning the calculated growth length to said anticipated value x, and calculating said SIV-ensured time $t_{open}$ by comparing said path length with said anticipated value x.

12. The method for evaluating reliability of the semiconductor device according to claim 11, wherein, in said calculating the path length, said path length is defined as:

$$\text{said path long} = d + 2h$$

(where d is a diameter of said via, and h is a depth that said via is buried within said copper interconnect).

13. The method for evaluating reliability of the semiconductor device according to claim 9, wherein said calculating the dimension of said contacting region includes calculating a path length from one end to the other end of the contacting region, and wherein said calculating the SIV-ensured time $t_{open}$ includes calculating a growth length of the void growing toward a direction in said processing time t at said predetermined temperature, assigning the calculated growth length to said anticipated value x, and calculating said SIV-ensured time $t_{open}$ by comparing said path length with said anticipated value x.

14. The method for evaluating reliability of the semiconductor device according to claim 13, wherein, in said calculating the path length, said path length is defined as:

$$\text{said path long} = d + 2h$$

(where d is a diameter of said via, and h is a depth that said via is buried within said copper interconnect).

15. The method for evaluating reliability of the semiconductor device according to claim 9, wherein said calculating the SIV-ensured time $t_{open}$ includes calculating said SIV-ensured time $t_{open}$ by substituting the dimension of said contacting region into said anticipated value x in a formula, said formula including variables of: said processing time t; said anticipated value x; and an interconnect parameter D representing diffuse-ability of said void in said copper interconnect.

16. The method for evaluating reliability of the semiconductor device according to claim 15, wherein said interconnect parameter D is calculated on the basis of a parameter selected from a group consisting of: a tensile stress of said copper interconnect, an orientation of a surface of said copper interconnect, a time required for conducting a surface treatment of said copper interconnect, and a combination of two or more thereof.

* * * * *